United States Patent
Hashimoto

(10) Patent No.: US 7,874,782 B2
(45) Date of Patent: Jan. 25, 2011

(54) WAFER TRANSFER APPARATUS AND SUBSTRATE TRANSFER APPARATUS

(75) Inventor: Yasuhiko Hashimoto, Kobe (JP)

(73) Assignee: Kawasaki Jukogyo Kabushiki Kaisha, Kobe (JP)

( * ) Notice: Subject to any disclaimer, the term of this patent is extended or adjusted under 35 U.S.C. 154(b) by 708 days.

(21) Appl. No.: 11/879,509

(22) Filed: Jul. 18, 2007

(65) Prior Publication Data

US 2008/0025824 A1     Jan. 31, 2008

(30) Foreign Application Priority Data

Jul. 20, 2006     (JP)     ............... 2006-198771

(51) Int. Cl.
*H01L 21/677*     (2006.01)
(52) U.S. Cl. ................ 414/217; 414/744.5; 414/935; 414/937; 414/939; 901/11
(58) Field of Classification Search ............. 414/217, 414/744.5, 935, 937, 939; 901/11
See application file for complete search history.

(56) References Cited

U.S. PATENT DOCUMENTS

| | | | |
|---|---|---|---|
| 2003/0202865 A1* | 10/2003 | Ponnekanti et al. | 414/217 |
| 2004/0013497 A1* | 1/2004 | Shirai | 414/217 |
| 2004/0191028 A1* | 9/2004 | Tamai | 414/217 |
| 2005/0011294 A1 | 1/2005 | Hashimoto et al. | |
| 2005/0063800 A1* | 3/2005 | Kurita et al. | 414/217 |
| 2005/0095089 A1* | 5/2005 | Hur et al. | 414/217 |
| 2005/0158153 A1* | 7/2005 | Sundar et al. | 414/217 |
| 2005/0220576 A1* | 10/2005 | Kim et al. | 414/217 |
| 2006/0045668 A1* | 3/2006 | Grabowski | 414/217 |
| 2006/0104750 A1* | 5/2006 | Lee et al. | 414/217 |
| 2006/0182532 A1* | 8/2006 | Okada et al. | 414/217 |

FOREIGN PATENT DOCUMENTS

| | | |
|---|---|---|
| JP | A-07-122618 | 5/1995 |
| JP | A 2003-45933 | 2/2003 |
| JP | A-2003-179120 | 6/2003 |
| JP | A-2004-502558 | 1/2004 |
| JP | A-2006-073834 | 3/2006 |
| KR | 10-2005-0008523 | 1/2005 |
| WO | WO 01/01454 A1 | 1/2001 |
| WO | WO 02/04176 A1 | 1/2002 |

\* cited by examiner

*Primary Examiner*—Michael S Lowe
(74) *Attorney, Agent, or Firm*—Oliff & Berridge, PLC

(57) ABSTRACT

A wafer transfer apparatus is provided. In a minimum transformed state where a robot arm is transformed such that a distance defined from a pivot axis to an arm portion, which is farthest in a radial direction relative to the pivot axis, is minimum, a minimum rotation radius R, is set to exceed ½ of a length B in the forward and backward directions of an interface space, the length B corresponding to a length between the front wall and the rear wall of the interface space forming portion, and is further set to be equal to or less than a subtracted value obtained by subtracting a distance L0 in the forward and backward directions from the rear wall of the interface space forming portion to the pivot axis, from the length B in the forward and backward directions of the interface space (i.e., $B/2 < R \leq B-L0$).

14 Claims, 15 Drawing Sheets

WAFER TRANSFER APPARATUS AND SUBSTRATE TRANSFER APPARATUS

CROSS REFERENCE TO RELATED APPLICATIONS

This application is based upon the prior Japanese Patent Application No. 2006-198771 filed on Jul. 20, 2006, the entire contents of which are incorporated herein by reference.

BACKGROUND OF THE INVENTION

1. Field of the Invention

The present invention relates to a wafer transfer apparatus for use in semiconductor processing equipment. The present invention also relates to a substrate transfer apparatus for transferring a substrate in an interface space, which is maintained in a predetermined atmosphere, of a substrate processing equipment.

2. Description of the Related Art

FIG. 13 is a section showing a semiconductor processing equipment 1 of the related art, which is partly cut away. The semiconductor processing equipment 1 is configured to include a wafer processing apparatus 2 and a wafer transfer apparatus 3. The wafer transfer apparatus is an equipment front end module (EFEM). Spaces 9, 10 in the semiconductor processing equipment 1 are filled with a predetermined atmospheric gas, respectively. Specifically, the wafer processing apparatus 2 includes a processing space 10 which is filled with a predetermined atmospheric gas. Similarly, the wafer transfer apparatus 3 includes an interface space 9 which is filled with a predetermined atmospheric gas.

Semiconductor wafers 4, which are contained in each front opening unified pod (FOUP) 5 serving as a substrate container, are each carried into the semiconductor processing equipment 1. The wafer transfer apparatus 3 includes an interface space forming portion 11, FOUP openers 6, and a wafer carrying robot 7. A box 11 defines the interface space 9. The interface space 9 is maintained in a cleaned state due to a dust collecting apparatus, such as a fan filter unit, which is fixed to the box 11 (i.e., interface space forming portion). Each FOUP opener 6 is adapted to open and close doors respectively provided in the FOUP 5 and the interface space forming portion 11. Each FOUP opener 6 can switch a state in which an internal space of each FOUP 5 and the interface space 9 are in communication with each other and a state in which they are closed to each other, by opening and closing each door. A wafer carrying robot 7 is contained in the interface space 9 and is adapted to carry each wafer 4 between each FOUP 5 and the wafer processing apparatus 2.

The wafer carrying robot 7 takes out each unprocessed wafer 4 from each FOUP 5 in a state wherein the FOUP 5 is held by the wafer transfer apparatus 3 and penetration of the outside air into the interface space 9 is prevented. Then, the robot 7 carries the unprocessed wafer 4 taken from the FOUP 5, passes through the interface space 9, and positions the wafer 4 in the processing space 10 of the wafer processing apparatus 2. In addition, the wafer carrying robot 7 takes out each processed wafer 4 from the processing space 10 of the wafer processing apparatus 2. Thereafter, the wafer carrying robot 7 carries the processed wafer 4 taken out from the processing space 10, passes through the interface space 9, and places the wafer 4 again in the internal space of the FOUP 5. By transferring each wafer 4 into the wafer processing apparatus 2 by using each FOUP 5 and the wafer transfer apparatus 3 in this manner, attachment of dust floating in the atmosphere to the wafer 4 to be processed can be prevented. For example, such a technique is disclosed in JP No. 2003-45933 A.

FIG. 14 is a plan view of a semiconductor processing equipment 1A of a first related art, which is partly cut away. A robot arm 14 of the wafer carrying robot 7 of the first related art includes a first link member 15a which is connected with a base 18 and can be pivoted about a pivot axis A0 set at the base 18, a second link member 15b which is connected with the first link member 15a and can be angularly displaced about a first joint axis A1 set at the first link member 15a, and a third link member 15c which is connected with the second link member 15b and can be angularly displaced about a second joint axis A2 set at the second link member 15b. The third link member 15c has a robot hand 12 provided at its distal end.

The wafer carrying robot 7 is set such that a minimum rotation region 17, which is required for the robot 7 to perform one rotation about the base 18 in a state wherein each link member 15a to 15c is angularly displaced relative to one another to make the smallest form of the robot 7, can be contained in the interface space 9. In other words, a minimum rotation radius R of the robot is set smaller than a half (½) of a length B (FIG. 15) in forward and backward directions of the interface space 9. In addition, a distance L11 between the pivot axis A0 and the first joint axis A1 and a distance L12 between the first joint axis A1 and the second joint axis A2 are set to be the same.

In order to enable the wafer transfer apparatus 3 to perform attaching and detaching operations of each FOUP 5 relative to the wafer transfer apparatus 3 and a transferring operation of each wafer 4 to and from each FOUP 5 held by the wafer transfer apparatus 3, at the same time, there is a case where three or four FOUP openers 6 are provided in the system. In such a case, the wafer carrying robot 7 of the first related art as described above can not reach, in some cases, the FOUP 5 that is farthest from the base 15, by using its hand 12. However, if attempting to extend the length of each link member in order to enlarge a movable region of the robot 7, the robot arm 14 may interfere with the interface space forming portion 11 and may be advanced into a robot invasion restricted region.

FIG. 15 is a plan view showing a semiconductor processing equipment 1B of a second related art, which is partly cut away. As shown in FIG. 15, in the second related art, in order to make it possible to transfer wafers 4 of all of the FOUPs 5, the wafer carrying robot 7 includes a robot main body 13 having a robot arm 14 and a running means 12 which is adapted to drive the robot main body 13 to run in directions Y parallel to the row of the FOUPs 5.

In the second related art, the running means 12 for driving the robot main body 13 to run is located in the interface space 9. The running means 12 can be achieved by employing a direct acting mechanism. It is difficult, however, to seal the direct acting mechanism against dust to be generated in a driving portion, as compared with the case of a rotation driving mechanism. Therefore, due to dust to be generated by the running means, cleanliness in the interface space 9 may tend to be degraded.

In the case of driving the robot main body 13 to run at a high speed, since the robot main body 13 is of a large size, power to be spent for the running operation of the robot main body 13 should be increased, with respect to the running means 12. In addition, the running means 12 should also be of a large size in order to support the robot main body 13, thus making it difficult to downsize the robot 7 and reduce the weight thereof. Because the running means 12 is of a large size, it is difficult to exchange the running means 12 in the case of occurrence of malfunctioning in the running means 12. In addition, the provision of such a running means 12 leads to further increase of the production cost.

Increase of the number of the link members of the robot arm 14 in order to enlarge the movable region of the wafer carrying robot 7 can make the running means 12 as disclosed in the second related art be unnecessary. However, in the case of increasing the number of the link members of the robot arm 14, the robot structure should be complicated so much. Additionally, the increase of the link members increases in turn redundancy of the robot, as such control of the robot arm 14 may tend to be difficult. For example, in regard to the wafer transfer, a teaching operation for teaching transformed states of the robot arm may be further complicated.

Such problems may occur in other apparatuses than the wafer transfer apparatus. Specifically, in the case of substrate transfer apparatuses each provided with a substrate carrying robot for carrying each substrate in the interface space which is maintained in a predetermined atmosphere, the same problems as those describe above may occur.

SUMMARY OF THE INVENTION

Accordingly, it is an object of the present invention to provide a wafer transfer apparatus having a wafer transfer robot which can suppress scattering of dust and prevent occurrence of interference in the interior of the wafer transfer apparatus, and has a simple structure and can be readily controlled.

Another object of the present invention is to provide a substrate transfer apparatus having a substrate transfer robot which can suppress scattering of dust and prevent occurrence of interference in the interior of the substrate transfer apparatus, and has a simple structure and can be readily controlled.

The present invention is a wafer transfer apparatus for transferring a semiconductor wafer which is carried while being contained in a substrate container, relative to a wafer processing apparatus for semiconductor processing, comprising: an interface space forming portion defining an interface space which is to be filled with a preconditioned atmospheric gas, the interface space forming portion having a front wall and a rear wall which are arranged at a predetermined interval in forward and backward directions, the front wall having a front opening formed therein, and the rear wall having a rear opening formed therein; a FOUP opener configured to open and close the substrate container located adjacent to the interface space and the front opening of the interface space forming portion; and a wafer carrying robot located in the interface space and configured to carry the semiconductor wafer between the front opening and the rear opening. The wafer carrying robot includes: a base which is fixed to the interface space forming portion and at which a predetermined pivot axis is set; a robot arm having a proximal end and a distal end, the robot arm including a plurality of link members connected with one another in succession in a direction from the proximal end to the distal end, the proximal end being connected with the base, the distal end being provided with a robot hand for holding the wafer, the robot arm being configured to be angularly displaced about the pivot axis; and a drive unit configured to drive each of the link members of the robot arm so that the link members are angularly displaced, individually, about each corresponding axis. In a minimum transformed state where the robot arm is transformed such that a distance defined from the pivot axis to an arm portion which is farthest in a radial direction relative to the pivot axis is minimum, a minimum rotation radius R, as the distance defined from the pivot axis to the arm portion which is the farthest in the radial direction relative to the pivot axis, is set to exceed ½ of a length B in the forward and backward directions of the interface space, the length B corresponding to a length between the front wall and the rear wall of the interface space forming portion, and is further set to be equal to or less than a subtracted value (B−L0) to be obtained by subtracting a distance L0 in the forward and backward directions from the rear wall of the interface space forming portion to the pivot axis, from the length B in the forward and backward directions of the interface space (i.e., B/2<R≦B−L0).

According to this invention the substrate container is located while being adjacent to the front opening of the interface space forming portion. In this state, the FOUP opener opens the substrate container together with the front opening so as to make the internal space of the substrate container and the interface space be in communication with each other. The wafer carrying robot takes out an unprocessed wafer from the substrate container, carries the unprocessed wafer into the interface space from the front opening, passes through the interface space, and carries the wafer into the wafer processing apparatus through the rear opening. Alternatively, the wafer carrying robot takes out a processed wafer which has been processed in the wafer processing apparatus, carries it into the interface space from the rear opening, passes through the interface space, and carries the wafer into the substrate container through the front opening.

In the interface space, the atmospheric gas is controlled. Thus, when carrying the unprocessed wafer into the wafer processing apparatus from the substrate container, or when carrying the processed wafer into the substrate container from the wafer processing apparatus, attachment of dust floating in the atmosphere to the wafer can be prevented, thereby enhancing the yield of the wafer to be processed.

In the present invention, the minimum rotation radius R of the robot arm can be increased, as compared to the first and second related arts described above, by setting the minimum rotation radius R of the robot arm at a value greater than ½ of the length B in the forward and backward directions of the interface space. In addition, with the minimum rotation radius R of the robot arm set to be equal to or less than the subtracted value (B−L0), a gap can be securely provided between the robot arm in its minimum transformed state and the front wall, thus preventing interference of the robot arm with the front wall. In this manner, a robot hand which is a distal end of the robot arm can be located on both sides in the left and right directions, orthogonally to both of the forward and backward directions and the pivot axial direction extending along the pivot axis, with respect to a reference line defined to include the pivot axis and extend in the forward and backward directions. By driving the robot arm to be operated in an operational range excluding an interferential operational range in which the robot arm would interfere with the rear wall, interference with the rear wall can also be prevented. Namely, with the restriction of the angularly displacing operational range of the robot arm to be less than 360 degrees, for example, about 180 degrees, interference of the robot arm with the rear wall can be prevented.

Thus, even though the length B in the forward and backward directions of the interface space is significantly small, the length of each link member of the robot arm can be increased, while preventing the interference of the robot arm with the front wall, so as to enlarge the operational range of the robot arm. In particular, the operational range of the robot arm can be enlarged with respect to the left and right directions orthogonal to both the forward and backward directions and the pivot axial direction. For example, the distance L0 in the forward and backward directions from the rear wall to the pivot axis A0 is set to be less than ⅕ of the length B in the forward and backward directions of the interface space (i.e., L0<B/5).

By increasing the link length of each link member of the robot arm, the operational range of the robot arm can be increased with respect to the left and right directions. Thus, as compared with the second related art, there is no need for a running means for driving the robot to run in the left and right directions, and a direct acting mechanism can be eliminated. Accordingly, dust to be generated by such a direct acting mechanism can be avoided, as such degradation of the cleanliness in the interface space can be prevented. In addition, the elimination of the running means leads to downsizing and weight reduction of the robot.

Also, by increasing the link length of each link member of the robot arm, it becomes possible to have the robot hand reach a predetermined position in a wider range. Additionally, necessity for increasing the number of the link members can be avoided, thus simplifying the robot structure. Furthermore, the redundancy of the robot can be reduced, and the control and teaching concerning transformed states for the robot arm can be simplified, thereby reducing possibility that the robot arm would collide with the interface space forming portion.

As described above, in this invention, scattering of dust can be suppressed due to elimination of the running means, as well as interference in the wafer transfer apparatus can be avoided. Therefore, a wafer transfer apparatus including a wafer carrying robot, which can achieve more simplified structure and control, can be provided.

Preferably, the minimum rotation radius R is set to be equal to or less than an allowable length (B−L0−E) to be obtained by subtracting the distance L0 in the forward and backward directions from the rear wall of the interface space forming portion to the pivot axis and a length E of a robot invasion restricted region, which is set for the FOUP opener and is measured from the front wall in the forward and backward directions toward the rear wall, from the length B in the forward and backward directions of the interface space (i.e., R≦B−L0−E).

According to this invention, by setting the minimum rotation radius R to be equal to or less than the allowable length (B−L0−E), even in the case where the robot arm approaches nearest relative to the front wall, entering of any portion of the robot arm into a movable region of the FOUP opener can be prevented. Therefore, interference of the robot arm with the FOUP opener can be prevented, regardless of the movable region or state of the FOUP opener. Thereby, defective operations of the wafer transfer apparatus can be eliminated.

Preferably, the robot arm includes: a first link member which is connected at its one end with the base, configured to be angularly displaced about the pivot axis, and at which a first joint axis is set in parallel to the pivot axis; a second link member which is connected at its one end with an other end of the first link member, configured to be angularly displaced about the first joint axis, and at which a second pivot axis is set in parallel to the pivot axis; and a third link member which is connected at its one end with an other end of the second link member, configured to be angularly displaced about the second joint axis, and includes the robot hand at an other end of the third link member for holding the wafer. A first link distance L1 defined as a distance from the pivot axis to an end of the first link member, which is farthest in a radial direction toward the first joint axis relative to the pivot axis, is set to exceed ½ of the allowable length (B−L0−E) and to be equal to or less than the allowable length (B−L0−E) (i.e., ((B−L0−E)/2<L1≦B−L0−E).

According to this invention, the first link distance L1 is set to exceed ½ of the allowable length (B−L0−E) and to be equal to or less than the allowable length (B−L0−E). Consequently, even in the case where the first link member approaches nearest relative to the front wall, entering of any portion of the first link member into a movable region of the FOUP opener can be prevented. Thus, the other end of the first link member can be moved on both sides in the left and right directions relative to the pivot axis while preventing its interference with the front wall. By increasing the first link distance L1, as large as possible, provided that it is set to be equal to or less than the allowable length (B−L0−E), interference of the first link member with the front wall as well as with the FOUP opener can be prevented, and the other end of the first link member can be moved into a significantly far position in both of the left and right directions with respect to the pivot axis, thereby to enlarge the operational range of the first link member. Namely, interference of the first link member with the front wall as well as with the FOUP opener can be prevented, while increasing the link length of the first link member. Additionally, due to restriction of the angularly displacing operational range of the robot arm to be less than 360 degrees, for example, about 180 degrees, interference of the first link member with the rear wall can also be prevented. Due to the increase of the length of the first link member, the second and third link members can be located in farther positions from the pivot axis in the left and right directions, thus enlarging the movable region of the robot in the left and right directions.

Preferably, a first axis-to-axis distance L11 from the pivot axis to the first joint axis and a second axis-to-axis distance L12 from the first joint axis to the second joint axis are set to be equal to each other. A second link distance L2 defined as a distance from the second joint axis to an end of the second link member, which is farthest in a direction toward the first joint axis relative to the second joint axis, is set to exceed ½ of the allowable length (B−L0−E) and to be equal to or less than the allowable length (B−L0−E).

According to this invention, in a state where the second link member is overlapped with the first link member with respect to the pivot axial direction such that the pivot axis is coincident with the second joint axis, the distance from the second joint axis to the end portion of the second link member, which is the farthest from the pivot axis, is set to be equal to or less than the allowable length (B−L0−E). Accordingly, in the state wherein the pivot axis is coincident with the second joint axis, entering of any portion of the second link member into the movable region of the FOUP opener can be prevented. Additionally, by increasing the second link distance L2, as large as possible, provided that it is set to be equal to or less than the allowable length (B−L0−E), interference of the second link member with the front wall as well as with the FOUP opener can be prevented, and the other end of the second link member can be moved into a significantly far position in both of the left and right directions with respect to the pivot axis, thereby to enlarge the operational range of the second link member. Namely, by driving the robot arm to take its minimum transformed state by overlapping the first link member with the second link member, interference of the second link member with the front wall as well as with the FOUP opener can be prevented, while increasing the link length of the second link member. This increase of the length of the second link member enables the third link member to be located in a position farther from the pivot axis in the left and right directions, thereby enlarging the movable region of the robot in the left and right directions.

By setting the first axis-to-axis distance L11 and the second axis-to-axis distance L12 to be the same, and by setting an angularly displacing amount of the first link member about the pivot axis to be twice the angularly displacing amount of the second link member about the first angular displacement axis, the other end of the second link member can be moved in parallel to the left and right directions, thus facilitating control of the arm body. It should be noted that the term "the same" is intended to imply substantially the same state, as such it includes the same state and substantially the same state.

Preferably, a third link distance L3 defined as a distance from the second joint axis to an end of the third link member or a portion of the wafer, which is farthest in a radial direction relative to the second joint axis, is set to exceed ½ of the allowable length (B–L0–E) and to be equal to or less than the allowable length (B–L0–E).

According to this invention, in a state wherein the first to third link members are overlapped such that the pivot axis is coincident with the second joint axis, the distance from the second joint axis to the end portion of the third link member, which is the farthest from the pivot axis, is less than the allowable length (B–L0–E). Accordingly, in the state where the pivot axis is coincident with the second pivot axis, entering of any portion of the third link member or any portion of the wafer held by the third link member into the movable region of the FOUP opener can be prevented. In addition, by increasing the third link distance L3, as large as possible, provided that it is set to be equal to or less than the allowable length (B–L0–E), interference of the third link member with the front wall as well as with the FOUP opener can be prevented, and the other end of the third link member can be moved into a significantly far position in both of the left and right directions with respect to the pivot axis, thereby to enlarge the operational range of the third link member. Namely, by operating the robot arm to take its minimum transformed state by driving the first to third link members to be overlapped with one another, interference of the third link member with the front wall as well as with the FOUP opener can be prevented, while increasing the link length of the third link member. Due to such increase of the length of the third link member, the wafer held by the third link member can be located in a farther position from the pivot axis in the left and right directions, thereby to extend the movable region of the robot in the left and right directions.

Preferably, the first link distance L1, the second link distance L2 and the third link distance L3 are respectively set to be equal to the allowable length (B–L0–E).

According to this invention, the first to third link distances L1 to L3 are each set to be the same as the allowable length (B–L0–E). Consequently, when the robot arm is in the minimum transformed state, contact of each link member with the front wall as well as with the FOUP opener can be prevented. The term "the same" is intended to imply substantially the same state, as such it includes the same state and substantially the same state. Since each link member is set to be as large as possible while preventing interference, the operational range of the robot arm with respect to the left and right directions can be increased. Thus, even in the case where the front opening and the rear opening are formed away from each other in the left and right directions, this robot arm can perform both carrying in and carrying out operations for each wafer. Namely, in the case where the robot arm takes its minimum transformed state, contact of each link member with the front wall as well as with the FOUP opener can be prevented. In addition, the length of each link member can be increased as large as possible, the operational range of the robot arm can be increased so much. Therefore, even in the case where the front opening and the rear opening are provided in positions spaced away relative to each other in the forward and backward directions, the robot arm can perform the carrying in and carrying out operations for each wafer.

Preferably, the front opening includes four openings which are formed in the interface space forming portion, the four openings being arranged in left and right directions orthogonal to both the forward and backward directions and a direction of the pivot axis. The FOUP opener includes four openers which are provided in order to open and close the four openings, respectively.

According to this invention, even in the case where the length B in the forward and backward directions of the interface space is relatively small as described above, the operational range in the left and right directions of the robot arm can be significantly increased. Thus, even in the case where the four FOUP openers are provided, carrying in and carrying out operations for each wafer between the substrate container attached to each FOUP opener and the wafer processing apparatus can be secured, without providing any additional running means for the robot, and without increasing the number of link members of the robot arm. Since the four FOUP openers are provided, the carrying, attachment and detachment operations of each substrate container relative to the wafer transfer apparatus and the transfer operation of each wafer contained in the substrate container held by the wafer transfer apparatus can be carried out, in parallel, thereby enhancing the working efficiency.

The present invention is a substrate transfer apparatus for transferring a substrate, in an interface space filled with a preconditioned atmospheric gas, relative to a substrate processing apparatus for processing the substrate, comprising: an interface space forming portion defining the interface space, the interface space forming portion having a front wall and a rear wall which are arranged in predetermined forward and backward directions at an interval, the front wall having a first transfer port formed therein, and the rear wall having a second transfer port formed therein; an opening and closing unit configured to open and close the first transfer port of the interface, space forming portion; and a substrate carrying robot located in the interface space and configured to carry the substrate between the first transfer port and the second transfer port. The substrate carrying robot includes: a base which is fixed to the interface space forming portion and at which a predetermined pivot axis is set; a first link member which is connected at its one end with the base, configured to be angularly displaced about the pivot axis, and at which a first joint axis is set in parallel to the pivot axis; a second link member which is connected at its one end with an other end of the first link member, configured to be angularly displaced about the first joint axis, and at which a second pivot axis is set in parallel to the pivot axis; a third link member which is connected at its one end with an other end of the second link member, configured to be angularly displaced about the second joint axis, and includes a robot hand at an other end thereof for holding the substrate; and a drive unit configured to drive each of the link members so that the link members are angularly displaced, individually, about each corresponding axis. The pivot axis is located nearer to the rear wall than to the front wall or nearer to the front wall than to the rear wall in the forward and backward directions. A first link distance L1 defined as a distance from the pivot axis to an end of the first link member, which is farthest in a radial direction toward the first joint axis relative to the pivot axis, is set to exceed ½ of a length B in the forward and backward directions of the interface space, the length B corresponding to a length between the front wall and the rear wall of the interface space forming portion, and is further set to be equal to or less than a subtracted value (B−L0) to be obtained by subtracting a distance L0 in the forward and backward directions from the rear wall of the interface space forming portion to the pivot axis, from the length B in the forward and backward directions of the interface space (i.e., B/2<L1≦B−L0).

According to this invention, the minimum rotation radius R of the robot arm can be increased, as compared with the first and second related arts, by setting the minimum rotation radius R of the robot arm to exceed ½ of the length B in the forward and backward directions of the ready arm. In addition, by setting the minimum rotation radius R of the robot arm to be equal to or less than the aforementioned subtracted value (B−L0), a gap can be securely provided between the robot arm in its minimum transformed state and the front wall, thus preventing interference of the robot arm with the front wall. With the restriction of the angularly displacing operational range of the robot arm to be less than 360 degrees, for example, about 180 degrees, interference of the robot arm with the rear wall can also be prevented.

Consequently, even in the case where the length B in the forward and backward directions of the interface space is relatively small, the link length of each link member of the robot arm can be increased, while preventing interference between the robot arm and the front wall. Accordingly, the operational range of the robot arm can be increased. In particular, the operational range of the robot arm can be increased, with respect to the left and right directions orthogonal to both of the forward and backward directions and the pivot axial direction. Thus, the robot arm can be adequately operated without requiring any additional running means and/or unduely increasing the number of the link members.

According to the substrate transfer apparatus of the present invention, there is no need for a running means for driving the robot to run in the left and right directions, and dust to be generated by such a running means can be avoided, thereby preventing degradation of the cleanliness in the interface space. In addition, the number of the link members required for the robot arm can be reduced, as such simplifying the robot structure. Moreover, the redundancy of the robot can be decreased, thereby to reduce the possibility that the robot arm would collide with the interface space forming portion.

As stated above, according to the present invention, scattering of dust can be suppressed due to the elimination of the running means, and occurrence of interference in the substrate transfer apparatus can be avoided due to the control of increase of the link members. Therefore, the substrate transfer apparatus comprising the substrate transfer robot which can simplify the structure and control can be provided. It should be appreciated that the substrate transfer apparatus can be applied to other substrates than the semiconductor wafer, and that these substrates may include those to be processed in a preset controlled space, for example, glass substrates or the like.

BRIEF DESCRIPTION OF THE DRAWINGS

The above and other objects, features and advantages of the present invention will become more apparent from the following description taken in connection with the accompanying drawings, in which:

FIG. 6 is a diagram showing a carrying operation, which is simplified, for carrying the wafer 24 located in the processing space 30 to the first FOUP 25a;

DESCRIPTION OF THE PREFERRED EMBODIMENTS

Figure 1:
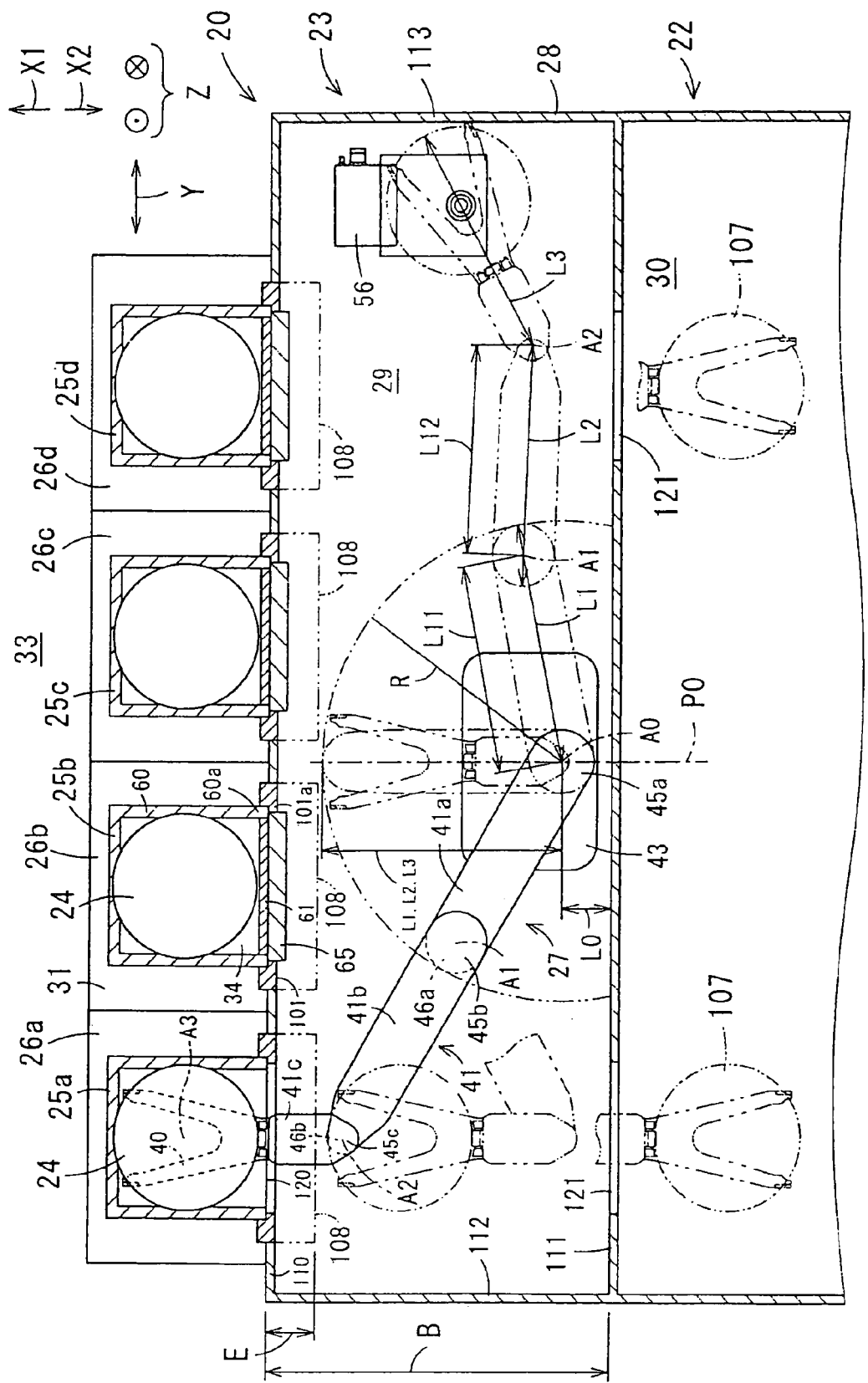
FIG. 1 is a plan view showing a part of semiconductor processing equipment 20 comprising a wafer transfer apparatus 23 which is a first embodiment of the present invention.
Figure 2:
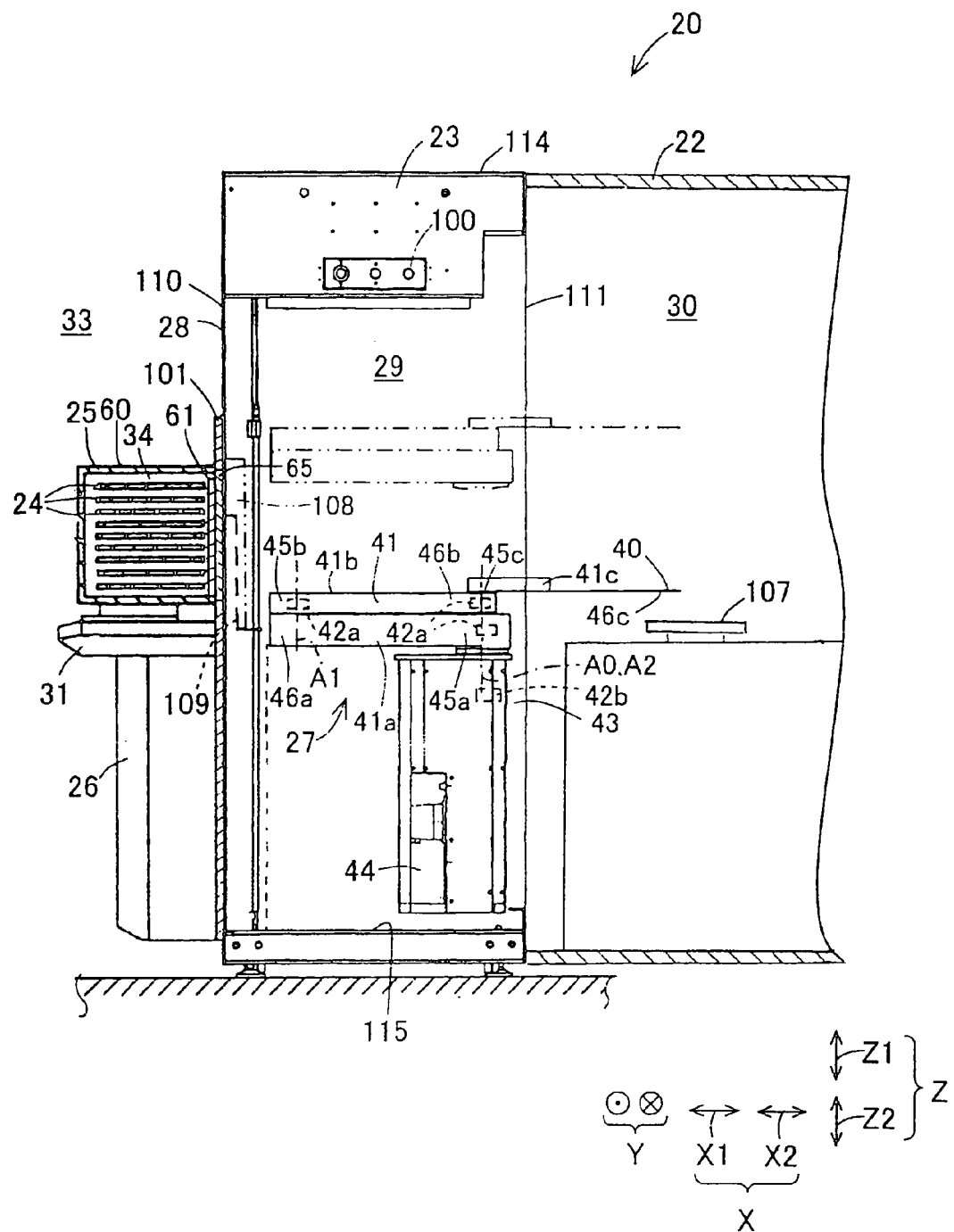
FIG. 2 is a section showing the semiconductor processing equipment 20, which is partly cut away.

As shown in FIGS. 1 and 2, the semiconductor processing equipment 20 according to the first embodiment of the present invention provides a predetermined process to each semiconductor wafer 24 which is a substrate to be processed. For example, as the process to be provided to the semiconductor wafer 24, various processes including heating, impurity doping, film forming, lithography, washing or flattening may be included. In addition, the semiconductor processing equipment 20 may perform other substrate processes than those described above.

The semiconductor processing equipment 20 performs the aforementioned processes in a processing space 30 filled with an atmospheric gas having adequate cleanliness. Wafers 24 are carried into the semiconductor processing equipment 20 while being contained in large numbers in a-substrate container referred to as a front opening unified pod (FOUP) 25. Each FOUP 25 is intended to serve as a mini-environmental substrate container configured to provide a clean environment for the locally cleaning technique.

Each FOUP 25 is configured to include a FOUP main body 60 which is a container main body in which the wafers 24 are contained, and a FOUP-side door 61 as a container-side door which can be attached to and detached from the FOUP main body 60. The FOUP main body 60 is formed into a generally box-like shape which opens in one direction, and in which a FOUP internal space 34 is defined as a space for containing the wafers. Due to attachment of the FOUP-side door 61 to the FOUP main body 60, the FOUP internal space 34 is closed air-tightly against an external space 33, as such invasion of contaminant, such as dust particles, from the external space 33 into the FOUP internal space 34 can be prevented. Contrary, due to removal of the FOUP-side door 61 from the FOUP main body 60, the wafer 24 can be contained in the FOUP internal space 34, as well as the wafers 24 contained in the FOUP internal space 34 can be taken out therefrom. Each FOUP 25 contains a plurality of wafers 24 therein in a stacked state in upward and downward directions Z. Each wafer 24 contained in the FOUP 25 is arranged at an equal interval in the upward and downward directions Z, with one face in the thickness direction extending horizontally.

The semiconductor processing equipment 20 is configured to include a wafer processing apparatus 22 and a wafer transfer apparatus 23. The semiconductor processing equipment 20 is prescribed, for example, in the SEMI (Semiconductor Equipment and Materials International) standard. In this case, for example, each FOUP 25 and a FOUP opener 26 adapted to open and close the FOUP 25 follow the specifications, including E47.1, E15.1, E57, E62, E63, E84, of the SEMI standard. It should be noted that even though the construction of the semiconductor processing equipment does not fall within the SEMI standard, such construction may also be included in this embodiment.

The wafer processing apparatus 22 provides the predetermined process described above to each wafer 24 in the processing space 30. In addition to a processing apparatus main body adapted to provide a process to each wafer 24, the wafer processing apparatus 22 includes a processing space forming portion defining the processing space 30, a carrier adapted to carry each wafer 24 in the processing space 30, and a controller adapted to control the atmospheric gas filled in the processing space 30. The controller can be achieved by a fan filter unit or the like.

The wafer transfer apparatus 23 is configured to take out each unprocessed wafer 24 from each FOUP 25 and supply it into the wafer processing apparatus 22, as well as configured to take out each processed wafer 24 from the wafer processing apparatus 22 and place it in each FOUP 25. The wafer transfer apparatus 23 is an equipment front end module (EFEM). The wafer transfer apparatus 23 serves as an interface, which is adapted to transfer each wafer 24 between each FOUP 25 and the wafer processing apparatus 22. In this case, the wafer 24 passes through an interface space 29 filled with a predetermined atmospheric gas and having high cleanliness, during its movement between each FOUP internal space 34 and the processing space 30 of the wafer processing apparatus 22.

The interface space 29 is a closed space to which contamination control is provided and in which the number of floating micro-particles in the air is controlled to be less than a limited level of cleanliness. In addition, the interface space 29 is a space in which environmental conditions, such as temperature, humidity and pressure, are also controlled as needed. In this embodiment, the cleanliness of processing space 30 and interface space 29 is maintained such that it does not have negative impact on the process for each wafer 24. For example, as the cleanliness, the CLASS1 prescribed in the international organization for standardization (ISO) is employed.

The wafer transfer apparatus 23 includes an interface space forming portion 28 defining the interface space 29, the wafer carrying robot 27 which is located in the interface space 29 and capable of carrying each wafer, FOUP openers 26 which serve as opening and closing apparatuses each adapted to open and close each corresponding FOUP 25, and an interface space controller 100 adapted to control an atmospheric gas filled in the interface space 29. In this embodiment, the wafer transfer apparatus 23 further includes an aligner 56 adapted to align a direction of each wafer 24 held in a predetermined position.

The interface space forming portion 28 surrounds the interface space 29 to prevent the outside air from entering the interface space 29 from the external space 33. In the interface space forming portion 28, carrier elements required for carrying each wafer 24 are fixed respectively. In this embodiment, four FOUP openers 26a, 26b, 26c, 26d, one wafer transfer robot 27, and one aligner 56 are fixed in the interface space forming portion 28, respectively.

The interface space forming portion 28 is formed into a rectangular parallelepiped box-like shape, so as to form a rectangular parallelepiped interface space 29. The interface space forming portion 28 includes a front wall 110 and a rear wall 111 which are arranged to provide a predetermined interval therebetween in forward and backward directions X. The front wall 110 serves as a partition for separating the interface space 29 from the external space 33 existing in a position on the side in the forward direction X1 relative to the interface space 29. The rear wall 111 serves as a partition for separating the interface space 29 from the processing space 30. Accordingly, the read space 29 is located on the side in the backward direction X2 relative to the external space 33 and is defined on the side in the forward direction X1 relative to the processing space 30.

The interface space forming portion 28 includes two side walls 112, 113 which are arranged to provide an interval in the left and right directions Y. In addition, the interface space forming portion 28 includes a ceiling wall 114 and a bottom wall 115 which are arranged to define an interval in the upward and downward directions Z. These walls 110 to 115 of the interface space forming portion 28 are each formed into a plate-like shape.

In this embodiment, the forward and backward directions X and the left and right directions Y are predefined directions, respectively. The forward and backward directions X and the left and right directions Y are orthogonal to the upward and downward directions Z, respectively, and extend horizontally to be orthogonal to each other. The backward direction X2 of the forward and backward directions X is a direction in which each wafer 24 contained in each FOUP 25 is carried into the processing space 30. The forward direction X1 of the forward and backward directions X is a direction in which each wafer 24 contained in the processing space 30 is carried back into each corresponding FOUP 25.

The first side wall 112 connects one ends together in the left and right directions of the front wall 110 and rear wall 111. The second side wall 113 connects the other ends together in the left and right directions of the front wall 110 and rear wall 111. The ceiling wall 114 connects top ends of the front wall 110, rear wall 111, first side wall 112 and second side wall 113, respectively. The bottom wall 115 connects bottom ends of the front wall 110, rear wall 111, first side wall 112 and second side wall 113, respectively.

The interface space 29 is closed in the forward and backward directions X by the front wall 110 and the rear wall 111. In addition, the interface space 29 is closed in the left and right directions Y by the first side wall 112 and the second side wall 113. Furthermore, the interface space 29 is closed in the upward and downward directions Z by the ceiling wall 114 and the bottom wall 115. In this manner, the interface space 29 is defined. The interface space forming portion 28 has a sectional shape vertical to the upward and downward directions Z such that the left and right directions Y corresponds to its longitudinal direction and the forward and backward directions X corresponds to its width direction, so as to be defined as a square frame. Accordingly, the interface space 29 defines an oblong space that is longer in the left and right directions Y than in the forward and backward directions X.

In the front wall 110, front openings 120 are formed, each extending through the wall in the forward and backward directions X, i.e., in the thickness direction. Each front opening 120 is formed to enable each wafer 24 to pass therethrough. Specifically, due to the wafer carrying robot 27, each wafer 24 is moved to pass through each corresponding front opening 120, and carried in the backward direction X2 relative to the front wall 110, thus inserted into the interface space 29 from the external space 33. Alternatively, due to the wafer carrying robot 27, each wafer 24 is moved to pass through each corresponding front opening 120, and carried in the forward direction X1 relative to the front wall 110, thus discharged into the external space 33 from the interface space 29. In this embodiment, four front openings 120 are provided such that the respective front openings 120 are arranged in the left and right directions Y.

In the rear wall 111, rear openings 121 are formed, each extending through the wall in the forward and backward directions X, i.e., in the thickness direction. Each rear opening 121 is formed to enable each wafer 24 to pass therethrough. Again, due to the wafer carrying robot 27, each wafer 24 is moved to pass through each corresponding rear opening 121, and carried in the backward direction X2 relative to the rear wall 111, thus inserted into the processing space 30 from the interface space 29. Alternatively, due to the wafer carrying robot 27, each wafer 24 is moved to pass through each corresponding rear opening 121, and carried in the forward direction X1 relative to the rear wall 111, thus inserted into the interface space 29 from the processing space 30. In this embodiment, two rear openings 121 are provided such that the respective rear openings 121 are arranged in the left and right directions Y.

The FOUP openers 26a to 26d are each configured to include a front face plate 101, an opener-side door 65, a FOUP supporting portion 31, and a door opening and closing mechanism 109. The FOUP openers 26a to 26d are arranged at an equal interval in the left and right directions Y. The FOUP openers 26a to 26d are located on the side in the forward direction X1 relative to the interface space forming portion 28. Each FOUP opener 26a to 26d also serves as a substrate container setting table for setting each corresponding FOUP, i.e., the substrate container. Accordingly, each FOUP opener 26a to 26d is adapted to work as the substrate container setting table for supporting at least each corresponding FOUP.

Each front face plate 101 constitutes a part of the front wall 110 of the interface space forming portion 28. The front face plate 101 of each FOUP opener 26a to 26d is a plate-like or frame-like member defining each front opening 120 described above therein, and constitutes the front wall 110 while being fixed to the remainder of the front wall 110. To the front opening 120 defined in each front face plate 101, the FOUP-side door 61 is provided such that it can pass therethrough in the forward and backward directions X.

Each opener-side door 65 is adapted to open and close each corresponding front opening 120. Each FOUP supporting portion 31 is located in the external space 33 on the side in the forward direction X1 relative to the interface space 29 and adapted to support each FOUP 25 from below. Each FOUP 25 is formed such that it can be located in an attaching position, which is set by each corresponding FOUP supporting portion 31, while being supported by the FOUP supporting portion 31. Hereinafter, the FOUPs supported correspondingly to the first to fourth FOUP openers 26a to 26d will be referred to as first to fourth FOUPs 25a to 25d, respectively. However, when it is not necessary to distinguish them as the first to fourth FOUPs 25a to 25d, they will be merely referred to as the FOUP(s) 25 or each FOUP 25.

In a state wherein the FOUP 25 is located in an attaching position, the opening 60a of the FOUP main body 60 is in contact with all the circumference of the opening portion 101a of the front face plate 101. In the state located in the attaching position, the FOUP door 61 is opposed from the external space 33 to the opener-side door 65 closing the front opening 120.

Each door opening and closing mechanism 109 is adapted to open and close each corresponding opener-side door 65 and FOUP-side door 61 while each corresponding FOUP 25 is located in the attaching position. When the door opening and closing mechanism 109 holds directly or indirectly the opener-side door 65 and the FOUP-side door 61, moves them from each opening 60a, 101a downward and in the backward direction X2, and then moves them to a release position set in the interface space 29, the FOUP internal space 34 and the interface space 29 are in communication with each other. Contrary, when the door opening and closing mechanism 109 attaches the opener-side door 65 and the FOUP-side door 61 to the openings 60a, 101a, respectively, the communication between the FOUP internal space 34 and the interface space 29 is shut off.

In the state wherein the FOUP 25 is located in the attaching position, the opening 60a of the FOUP main body 60 and the opening 101a of the front face plate 101 are in contact with each other over all of their peripheries. Accordingly, in the state wherein the FOUP 25 is located in the attaching position, even when the opener-side door 65 and the FOUP-side door 61 are removed from the respective openings 60a, 101a due to the door opening and closing mechanism 109, entering of the outside air into the FOUP internal space 34 and the interface space 29 can be prevented.

The respective FOUP openers 26a to 26d are arranged in the left and right directions Y, and configured to operate individually. FIG. 1 illustrates a state wherein the first FOUP opener 26a positioned on the most left side (in the drawing) opens the corresponding front opening 120. In addition, FIG. 1 shows a state wherein the FOUP openers 26b to 26d other than the first FOUP opener 26a close the corresponding front openings 120, respectively.

For each FOUP opener 26a to 26d, a movable region 108 is set, in which each door 61, 65 can be moved to the release position, due to the door opening and closing mechanism 109. The movable region 108 of each FOUP opener 26a to 26d is set in the interface space 29 and is defined near the front wall 110 in the interface space 29.

The wafer transfer robot 27, in this embodiment, is achieved by a horizontal articulated robot of a selective compliance assembly robot arm (SCARA) type. The robot 27 is located in the interface space 29 and is configured to include a robot arm 41, a horizontal drive means 42a, a vertical drive means 42b, a base 43, and a controller 44.

The robot arm 41 has a link structure including a plurality of link members 41a to 41c which are successively connected in a direction from a proximal end to a distal end. A robot hand 40 is provided at the distal end of the robot arm 41. The robot hand 40 has a holding structure which can hold the wafer 24. The holding of the wafer 24 is intended herein to express a state wherein the wafer 24 can be carried by using the hand 40. Accordingly, the wafer 24 may be mounted onto, sucked or held by, the hand 40.

The horizontal drive means 42a is adapted to drive the respective link members 41a to 41c of the robot arm 41 to be angularly displaced about joint axes A0 to A2, respectively. The robot arm 41 can drive the robot hand 40 by using the horizontal drive means, such that the robot hand 40 can be displaced in any position on a horizontal plane in a movable region, due to the relative angular displacement of each link member 41a to 41c. The horizontal drive means 42a includes a motor adapted to provide angular displacement in accordance with a signal to be given from the controller 44, and a power transmission mechanism adapted to transmit power of the motor to each link member. The motor and the power transmission mechanism are provided for each link member 41a to 41c.

The vertical drive means 42b is adapted to drive the robot arm 41 to be displaced in the upward and downward directions Z. The vertical drive means 42b includes a fixed portion and a movable portion, wherein the movable portion can be angularly displaced in the upward and downward directions relative to the fixed portion. The vertical drive means 42b further includes a motor adapted to provide angular displacement in accordance with a signal to be provided from the controller 44, and a power transmission mechanism which converts power of the motor into power for direct advance of the movable portion relative to the fixed portion and transmit the power to the movable portion. The fixed portion of the vertical drive means 42b is supported by the base 43. The base 43 is adapted to support the vertical drive means 42b and is fixed to the interface space forming portion 28.

The controller 44 is adapted to control the horizontal drive means 42a and the vertical drive means 42b in accordance with a transfer instruction to be inputted from a predetermined operational program or from a user and move the robot hand 40 to a preset position. The controller 44 includes a memory circuit for storing a predetermined program, an operational circuit for calculating the operational program stored in the memory circuit, and an output means adapted to provide signals expressing results of the calculation given from the operational circuit to the horizontal drive means 42a and the vertical drive means 42b. For example, the memory circuit can be achieved by a random access memory (RAM) and/or a read only memory (ROM), and the operational circuit can be realized by a central processing unit (CPU).

Due to fixation of a proximal end of the robot arm 41 to the movable portion of the vertical drive means 42b, the controller 44 can drive and displace the robot hand 40 of the robot arm 41 to any position in the forward and backward directions X, left and right directions Y and upward and downward directions Z, in a movable range. In addition, due to the control of the horizontal drive means 42a and the vertical drive means 42b by virtue of the controller 44, the wafer 24 held by the robot hand 40 can be transferred. Thus, the wafer 24 can be transferred, along a predetermined route, between each FOUP 25 and the wafer processing apparatus 22.

The robot hand 40 passes through the front opening 120 and is advanced into the FOUP internal space 34 while the corresponding opener 26a to 26d opens the FOUP-side door 61 so as to hold a wafer 24 contained in the FOUP 25. Thereafter, the robot hand 40 is moved through the interface space 29 while holding the wafer 24, passes through the rear opening 121, and is advanced into the processing space 33 of the semiconductor processing apparatus 22 so as to place the held wafer 24 onto a preset wafer holding position 107. Alternatively, the robot hand 40 passes through the rear opening 121, and is advanced into the processing space 30 so as to hold the wafer 24 held in the wafer holding position 107. Subsequently, the robot hand 40 is moved through the interface space 29 while holding the wafer 24, passes through the front opening 120, and is advanced into the FOUP internal space 34 so as to transfer the held wafer 24 to a position for containing it in the FOUP 25.

In this embodiment, since the four FOUP openers 26a to 26d are provided, the robot hand 40 is set to be able to take out and put in each wafer 24 relative to each FOUP 25 supported by each FOUP supporting portion 31 of each opener 26. The robot hand 40 can also carry the wafer 24 taken out from the FOUP 25 to a holding position set in the aligner 56 as well as can carry the wafer 24 taken out from the holding position of the aligner 56 into the wafer processing apparatus 22.

The aligner 56 is located in the interface space 29 and positioned more right than the fourth FOUP opener 26d which is positioned on the most right side (in the drawing) of the plurality of FOUP openers 26a to 26d. The aligner 56 has a holding portion for holding each wafer 24, and is configured to rotate the wafer 24 held by the holding portion so as to align a notch or ori-flat (orientation flat) formed in the wafer 24 with a predetermined direction. Accordingly, when the so-aligned wafer 24 is held by the robot hand 40, the wafer 24 can be located in the processing apparatus 22 with its orientation adjusted. In this way, the processing apparatus 22 can provide a predetermined process with the orientation of each wafer 24 being properly controlled.

A central position of each wafer 24 held by the aligner 56 is set at approximately the center of the interface space 29 in the forward and backward directions X. The aligner 56 is located in a position that does not interfere with the travel of the robot hand 40 to each FOUP opener 26. As such, in this embodiment, the aligner 56 is positioned more right than the fourth FOUP opener 26d which is positioned on the most right side.

As described above, the wafer transfer robot 27 is located in the interface space 29, and serves to mainly move the robot hand 40 in the interface space 29. The wafer transfer robot 27 is configured to make the robot hand 40 pass through the front opening 120 so as to enable each wafer 24 to be taken out from the FOUP internal space 34 as well as to enable the wafer 24 to be placed into the FOUP internal space 34. The wafer transfer robot 27 is also configured to have the robot hand pass through the rear opening 121 so as to enable each wafer 24 to be taken out from the wafer holding position 107 of the processing space 30 as well as to enable the wafer 24 to be placed in the wafer holding position 107 of the processing space 30. Furthermore, the wafer transfer robot 27 is configured such that it can pass through the four front opening 120 respectively provided in the four FOUP openers 26a to 26d.

Accordingly, the wafer transfer robot 27 is configured such that it can carry the robot hand 40 in the forward and backward directions X over a distance greater than the length B in the forward and backward directions of the interface space 29. The wafer transfer robot 27 is configured to enable the robot hand 40 to be moved in the left and right directions Y such that it can access the FOUP 25 supported by each FOUP opener 26a to 26d. Moreover, in this embodiment, the wafer transfer robot 27 is configured to enable the robot hand 40 to be moved in the left and right directions Y such that it can access the aligner 56.

The base 43 is fixed to the interface space forming portion 28, at which the predetermined pivot axis A0 is set. The pivot axis A0, in this embodiment, extends in the vertical direction, and is positioned near the rear wall 111 in the interface space 29. The pivot axis A0 is defined in a central position between the most left FOUP opener 26a and the most right FOUP opener 26d in the left and right directions Y.

The robot arm 41 is configured to have a link structure in which the plurality of link members 41a to 41c are connected with one another. A proximal end the robot arm 41 is defined at one end of an arrangement in which the plurality of link member 41a to 41c are successively arranged, and a distal end thereof is defined at the other end of the arrangement. The proximal end of the robot arm 41 is fixed to the movable portion of the vertical drive means 42b, and is connected with the base 43 via the vertical drive means 42b. At the distal end of the robot arm 41, the robot hand 40 is provided. The robot arm 41 is configured such that the proximal end can be angularly displaced about the pivot axis A0.

Specifically, the robot arm 41 includes the first to third link members 41a, 41b, 41c. Each of the link members 41a to 41c is formed into an elongated shape extending in its longitudinal direction. The first link member 41a is connected, at its one end 45a in its longitudinal direction, with the movable portion of the vertical drive means 42b. The first link member 41a is configured such that it can be angularly displaced about the pivot axis A0 relative to the movable portion of the vertical drive means 42b. At the other end 46a in the longitudinal direction of the first link member 41a, the first joint axis A1 is set, which is parallel with the pivot axis A0. Accordingly, the first joint axis A1 is moved along with movement of the first link member 41a. The longitudinal direction of the first link member 41a is defined by a line connecting the pivot axis A0 with the first joint axis A1.

The second link member 41b is connected, at its one end 45b in its longitudinal direction, with the other end 46a in the longitudinal direction of the first link member 41. The second link member 41b is configured such that it can be angularly displaced about the first joint axis A1 relative to the first link member 41a. At the other end 46b in the longitudinal direction of the second link member 41b, the second joint axis A2 is set, which is parallel with the pivot axis A0. Accordingly, the second joint axis A2 is moved along with movement of the second link member 41b. The longitudinal direction of the second link member 41b is defined by a line connecting the first joint axis A1 with the second joint axis A2.

The third link member 41c is connected, at its one end 45c in its longitudinal direction, with the other end 46b in the longitudinal direction of the second link member 41b. The third link member 41c is configured such that it can be angularly displaced about the second joint axis A2 relative to the second link member 41b. At the other end 46c in the longitudinal direction of the third link member 41c, the robot hand 40 is provided. Accordingly, the robot hand 40 is moved along with movement of the third link member 41c. The longitudinal direction of the third link member 41c is defined by a line connecting the second joint axis A2 with the central position A3 of the wafer 24 which is held by the robot hand 40.

In this manner, the robot arm has the link structure comprising the three link members 41a to 41c. The horizontal drive means 42a includes first to third motors. The first motor is adapted to rotate and drive the first link member 41a about the pivot axis A0. The second motor is adapted to rotate and drive the second link member 41b about the first joint axis A1. The third driving source is a motor which serves to rotate and drive the third link member 41c about the second joint axis A2. As such, the horizontal drive means 42a can angularly displace the first to third link members 41a to 41c, individually, about the corresponding angular displacement axes A0 to A2, respectively.

As shown in FIG. 2, the second link member 41b is located above the first link member 41a. Thus, the second link member 41b can be moved in a position which is overlapped with the first link member 41a in the upward and downward directions Z, thereby to prevent interference of the first link member 41a with the second link member 41b. Similarly, the third link member 41c is located above the second link member 41b. Accordingly, the third link member 41c can be moved in a position which is overlapped with the second link member 41b, as such preventing each interference of the first link member 41a to the third link member 41c.

Figure 3:
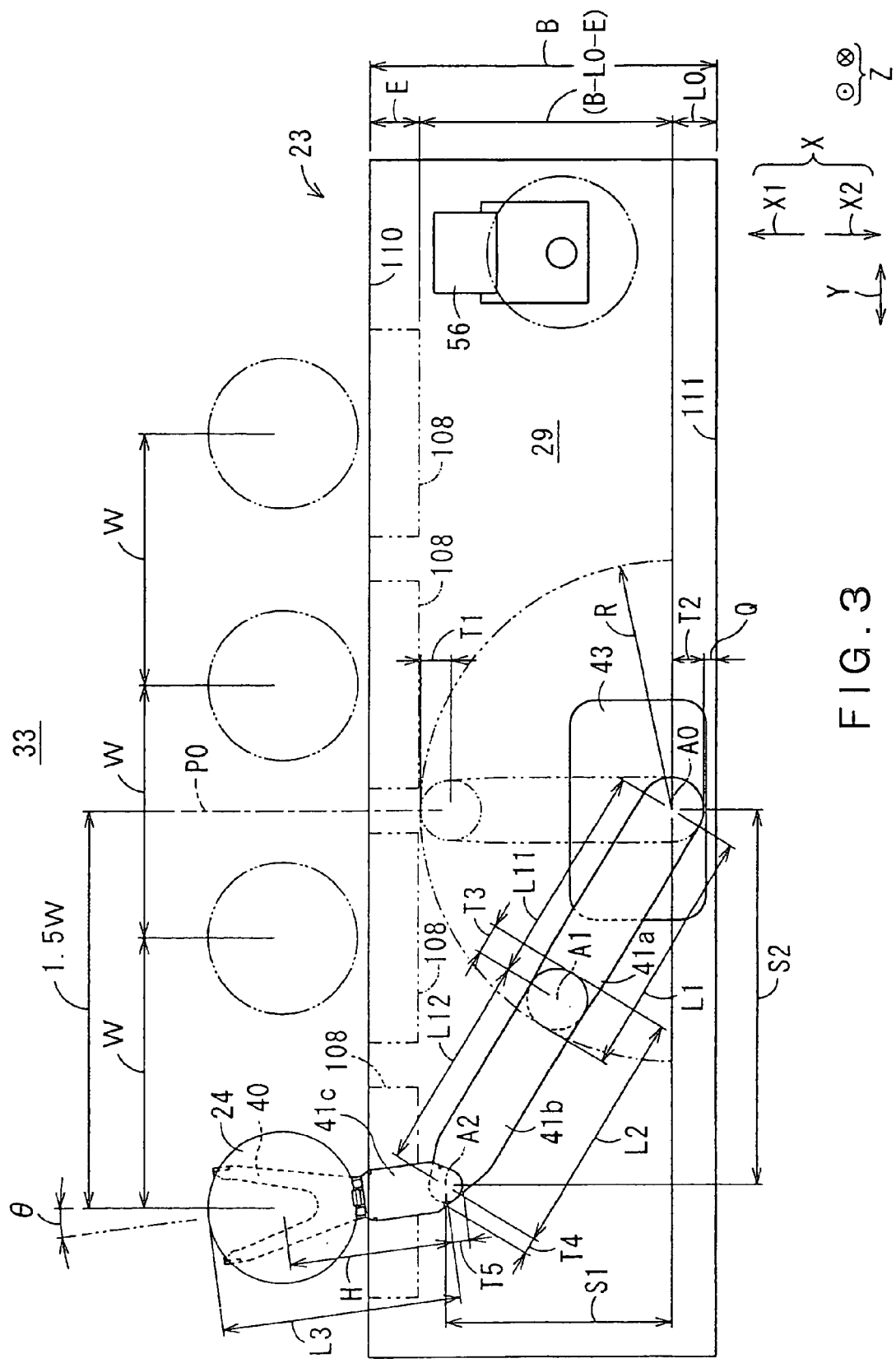
FIG. 3 is a plan view showing a wafer transfer apparatus, which is simplified, for explaining a length of each link member 41a to 41c.

FIG. 3 is a plan view showing the wafer transfer apparatus 23, which is simplified, for explaining a length of each link member 41a to 41c. Due to the angular displacement of each link member 41a to 41c about each corresponding angular displacement axis A0 to A2, the robot arm 41 can be transformed into its minimum state. A minimum transformed state means a transformed state wherein a distance, defined from the pivot axis A0 to an arm portion, which extends in the horizontal direction and is the farthest in the radial direction from the pivot axis A0, is the minimum. More specifically, the minimum transformed state means a transformed state wherein a distance, from the pivot axis A0 to an arm portion or a portion of the wafer 24, which is the farthest in the radial direction from the pivot axis A0, with the wafer 24 being held by the robot arm 41, is the minimum.

Hereinafter, in the minimum transformed state, the distance, from the pivot axis A0 to the arm portion or wafer portion, which is farthest in the radial direction relative to the pivot axis A0, will be referred to as "the minimum rotation radius R of the robot." The length between the front wall 110 and the rear wall 111 constituting the interface space 29 in the forward and backward directions X will be referred to as "the length B of the interface space in the forward and backward directions."

In this embodiment, the minimum rotation radius R of the robot is longer than a half (½) of the length B of the interface space in the forward and backward directions. In addition, the minimum rotation radius R is set to be equal to or less than a subtracted value (B−L0) obtained by subtracting a distance L0 in the forward and backward directions from the rear wall 111 to the pivot axis A0, from the length B of the interface space in the forward and backward directions (i.e., B/2<R≦B−L0). Accordingly, even when the robot arm 41 is transformed into its minimum transformed state, an amount of angular displacement of the robot arm 41 is restricted such that it can be angularly displaced about the pivot axis A0 within an allowable angular displacement range that can prevent interference of the robot arm 41 with the rear wall 111. In this embodiment, the allowable angular displacement range is set to be smaller than 360 degrees, for example, about 180 degrees, about the pivot axis A0. Thus, interference of the robot 27, which is maintained in the minimum transformed state, with the front wall 110 as well as with the rear wall 111 can be prevented, as long as it is operated within the allowable angular displacement range.

The distance L0 in the forward and backward directions from the rear wall 111 to the pivot axis A0 is set at, at least, a value smaller than ½ of the length B in the forward and backward directions of the interface space (i.e., L0<B/2). In this embodiment, the distance L0 in the forward and backward directions from the rear wall 111 to the pivot axis A0 is set to be less than ⅕ of the length B in the forward and backward directions of the interface space (i.e., L0<B/5). Furthermore, the distance L0 in the forward and backward directions from the rear wall 111 to the pivot axis A0 is set to be greater by a predetermined gap length Q than a radius T2 of an outer circumference of the first link member 41a about the pivot axis A0, over the whole area wherein the outer circumference of the first link member 41a is on the opposite side of the first joint axis A1 with respect to the pivot axis A0 (i.e., L0=T2+Q). The predetermined gap length Q is sufficient for preventing the interference that would be otherwise caused by the robot, and in this embodiment, it is set at 30 mm.

More specifically, in this embodiment, the minimum rotation radius R of the robot is set to exceed ½ of an allowable length (B−L0−E) to be obtained by subtracting the distance L0 in the forward and backward directions from the rear wall of the interface space forming portion to the pivot axis and a length E of a robot invasion restricted region, which is set for each FOUP opener 26 and is measured from the front wall 110, in the forward and backward directions X, on the rear wall side, from the length B in the forward and backward directions of the interface space, as well as set to be equal to or less than the allowable length (B−L0−E) (i.e., ((B−L0−E)/2<R≦B−L0−E). Thus, interference of the robot 27, which is maintained in its minimum transformed state, with each FOUP opener 26 can be prevented.

A distance from the pivot axis A0 to an end of the first link member 41a, which is the farthest in the axial direction toward the first joint axis A1 relative to the pivot axis A0, is referred to as a first link distance L1. The first link distance L1 is set to exceed ½ of the allowable length (B−L0−E) described above and to be equal to or less than the allowable length (B−L0−E) (i.e., ((B−L0−E)/2<L1≦B−L0−E). The first link member 41a is formed such that a radius T1 of the outer circumference of the first link member 41a about the first joint axis A1 is equal to or less than a value to be obtained by subtracting the distance L11 (first axis-to-axis distance) between the pivot axis A0 and the first joint axis A1, from the allowable length (B−L0−E), over the whole area wherein the outer circumference of the first link member 41a is on the opposite side of the pivot axis A0 with respect to the first joint axis A1 (i.e., T1≦B−L0−E−L11).

The first link member 41a is formed such that the radius T2 of the outer circumference of the first link member 41a about the pivot axis A0 is less than the distance L0 in the forward and backward directions from the rear wall 111 to the pivot axis A0, over the whole area wherein the outer circumference of the first link member 41a is on the opposite side of the first joint axis A1 with respect to the pivot axis A0 (i.e., T2<L0). Consequently, even in the case where the first link member 41a is angularly displaced by 90 degrees, from a state wherein the longitudinal direction of the first link member 41a is coincident with the forward and backward directions X, in one of the circumferential directions about the pivot axis A0, or alternatively, even in the case where it is angularly displaced by 90 degrees from the above state in the other circumferential direction about the pivot axis A0, interference of the first link member 41a with the rear wall 111 can be prevented.

In this embodiment, the first axis-to-axis distance L11 between the pivot axis A0 and the first joint axis A1 and the second axis-to-axis distance L12 between the first joint axis A1 and the second joint axis A2 are set to be the same. As used herein, the term "the same" is intended to imply a state that is substantially the same, as such referring to both the same and substantially the same states. In this embodiment, a distance from the second joint axis A2 to an end of the second link member 41b, which is the farthest in the direction toward the first joint axis A1 relative to the second joint axis A2, is referred to as a second link distance L2. The second link distance L2 is set to exceed ½ of the allowable length (B−L0−E) and to be equal to or less than the allowable length (B−L0−E) (i.e., (B−L0−E)/2<L2≦B−L0−E).

The second link member 41b is formed such that a radius T3 of the outer circumference of the second link member 41b about the first joint axis A1 is equal to or less than a value (B−L0−E−L11) to be obtained by subtracting the first axis-to-axis distance L11 from the allowable length (B−L0−E), over the whole area wherein the outer circumference of the second link member 41b is on the opposite side of the second joint axis A2 with respect to the first joint axis A1 (i.e., T3≦B−L0−E−L11). The second link member 41b is formed such that a radius T4 of the outer circumference of the second link member 41b about the second joint axis A2 is smaller than the distance L0 in the forward and backward directions from the rear wall 111 to the pivot axis A0, over the whole area wherein the outer circumference of the second link member 41b is on the opposite side of the first joint axis A1 with respect to the second joint axis A2 (i.e., T4<L0).

In this embodiment, in a state wherein the robot hand 40 holds the wafer 24, a distance from the second joint axis A2 to an end of the third link member 41c or a wafer portion, which is the farthest from the second joint axis A2 in the radial direction with respect to the second joint axis A2, is referred to as a third link distance L3. The third link distance L3 is set to exceed ½ of the allowable length (B−L0−E) and to be equal to or less than the allowable length (B−L0−E) (i.e., ((B−L0−E)/2<L1≦B−L0−E). The third link member 41c is formed such that a radius T5 of the outer circumference of the third link member 41c about the second joint axis A2 is smaller than the distance L0 in the forward and backward directions from the rear wall 111 to the pivot axis A0, over the whole area wherein the outer circumference of the third link member 41c is on the opposite side of the wafer holding central position A3 with respect to the second joint axis A2 (i.e., T5<L0).

In this embodiment, the first link distance L1 and the second link distance L2 are set to be equal to the allowable length (B−L0−E). The first axis-to-axis distance L11 and the second axis-to-axis distance L12 are set to be the same distance that enables the wafer 24 supported by each FOUP opener 26a to 26d to be taken out therefrom. In this embodiment, the third link distance L3 is also set to be the same as the allowable length (B−L0−E). As shown in FIG. 3, the robot hand 40 is set such that it can hold the wafer 24 in a state wherein the first link member 41a and the second link member 41b are extended in a straight line.

In the case where the third link member 41 is located in a position to hold the wafer 24 contained in the first FOUP 25a supported by the first FOUP opener 26a, a distance in the forward and backward directions X from the second joint axis A2 to the pivot axis A0 is designated by S1. A distance in the left and right directions from the second joint axis A2 to the pivot axis A0 is designated by S2. In addition, a distance obtained by summing up the first axis-to-axis distance L11 and the second axis-to-axis distance L12 is expressed by (L11+L12).

In this embodiment, each axis-to-axis distance L11, L12 is set to satisfy the following relation ship: (L11+L12)=(S1²+S2²)^{0.5}. Because each axis-to-axis distance L11, L12 is set to be equal, each axis-to-axis distance L11, L12 is defined as ((S1²+S2²)/4)^{0.5}. Thus, as shown in FIG. 3, the robot hand 40 can reach the wafer 24 contained in the first FOUP 25a while the longitudinal direction of the first link member 41a and the longitudinal direction of the second link member 41b are arranged to constitute together a straight line. Since the pivot axis A0 is located in a central position relative to the FOUP openers 26a to 26d, the robot hand 40 can also reach the wafer 24 contained in the fourth FOUP 25d while the longitudinal direction of the first link member 41a and the longitudinal direction of the second link member 41b are arranged to constitute together a straight line. In this way, since the first link member 41a and the second link member 41b can take a form to constitute together a straight line, each of the first axis-to-axis distance L11 and second axis-to-axis distance L12 can be significantly reduced.

In addition, the robot hand 40 may be configured to reach the wafer 24 contained in the first FOUP 25a or fourth FOUP 25d while the third link member 41c is inclined to the forward and backward directions X. As such, each of the first axis-to-axis distance L11 and second axis-to-axis distance L12 can be further reduced.

In this embodiment, each space in the left and right directions Y between the wafer central positions A3 of the wafers 24 contained in the first FOUP 25a to fourth FOUP 25d is designated by W. In addition, in the state wherein the robot hand 40 reaches the wafer 24 contained in the first FOUP 25a, an angle at which the third link member 41 is inclined relative to the forward and backward directions X is expressed by $\theta$. In this state, a distance from the wafer central position A3 to the second joint axis A2 is designated by H. Also in this state, a value (S1−L11) to be obtained by subtracting the first axis-to-axis distance L11 from the distance S1 in the forward and backward directions from the second joint axis A2 to the pivot axis A0 is expressed by C. Using these expressions, the first axis-to-axis distance L11 can be expressed as follows.

$$(2 \cdot L11)^2 \geq (L11+C)^2 + (1.5 \cdot W - H \cdot \sin \theta)^2 \quad (1)$$

For example, in the case where C=0, $\theta$=0, and W=505 mm, each axis-to-axis distance L11, L12 is equal to or greater than 437.3 mm. Now, assume that the length E of the robot invasion restricted region in the forward and backward directions X, which is set for each FOUP opener 26 and is measured from the front wall 110 on the rear wall side, is 100 mm. In addition, assume that the distance L0 in the forward and backward directions from the rear wall 111 to the pivot axis A0 is 65 mm, and that a distance L10 (R−L11) to be obtained by subtracting the first axis-to-axis distance L11 from the minimum rotation radius R of the robot is 50 mm. The resultant length B in the forward and backward directions of the interface space is equal to or greater than 652.3 mm (i.e., B≧L11+E+L0+L10). In other words, if the length B in the forward and backward directions of the interface space is 652.3 mm, the wafer 24 contained in each of the first and fourth FOUPs 25a, 25d supported by each corresponding FOUP opener 26a, 26d can be taken out, by setting each axis-to-axis distance L11, L12 at 437.3 mm. Of course, the wafer 24 contained in each of the second and third FOUPs 25b, 25c, which are located nearer to the pivot axis A0 than the first and fourth FOUPs 25a, 25d, can also be taken out.

In this embodiment, the length B in the forward and backward directions of the interface space is 694 mm. The minimum rotation radius R of the robot is set at 485 mm, and the first axis-to-axis distance L11 and the second axis-to-axis distance L12 are each set at 425 mm. In the state wherein the wafer 24 is held by the robot hand 40, the distance H from the second joint axis A2 to the wafer central position A3 is set at 320 mm. In addition, the third link distance L3 is set at 470 mm.

For example, if $\theta$=5°, H=330 mm, and the other conditions are the same as described above, each axis-to-axis L11, L12 to be obtained is equal to or greater than 420.4 mm, and the length B in the forward and backward directions of the interface space is to be equal to or greater than 635.4 mm. Alternatively, if C=10 mm, $\theta$=5°, H=330 mm, and the other conditions are the same as described above, each axis-to-axis L11, L12 to be obtained is equal to or greater than 417.5 mm and the length B in the forward and backward directions of the interface space is to be equal to or greater than 632.5 mm.

By inclining the longitudinal direction of the third link member 41c relative to the forward and backward directions X in the state wherein the robot hand 40 reaches the wafer 24, the wafer contained in each FOUP 25a to 25d can be taken out without unduly extending the first link member 41a and the second link member 41b.

In the embodiment described above, due to the pivot axis A0 arranged near the rear wall 111 and due to the minimum rotation radius R of the robot arm 41, which is set to exceed ½ of the subtracted value (B−L0) and to be equal to or less than the subtracted value (B−L0), a gap can be securely provided between the robot arm 41, which is in the minimum transformed state, and the front wall 101, as such preventing interference of the robot arm 41 with the front wall 101. Accordingly, the robot hand 40 can be located, on both sides in the left and right directions Y, with respect to a reference line P0 extending in the forward and backward directions X and including the pivot axis A0.

In addition, since the robot arm 41 can be operated in an operational range excluding such a range that would potentially interfere with the rear wall 111, the interference of the robot with the rear wall 111 can also be prevented. Accordingly, while the length B in the forward and backward directions of the read space is relatively small, each wafer 24 contained in a plurality of, for example, four, FOUPs, i.e., the first to fourth FOUP 25a to 25d, supported by the four FOUP openers 26a to 26d, can be taken out, by using the robot arm 41 having the link structure comprising the three link members 41a to 41c.

In this embodiment, by setting the minimum rotation radius R of the robot to be equal to or less than the allowable length (B−L0−E), even though the robot arm 41 taking its minimum transferred state approaches nearest relative to the front wall 101, entering of a part of the robot arm 41 into the robot invasion restricted region E of each FOUP opener 26a to 26d can be prevented. Thus, interference between the robot arm 41 with each FOUP opener 26a to 26d can be prevented, regardless of a movable range or state of each FOUP opener 26a to 26d.

The first to third link distances L1 to L3 are set to exceed ½ of the allowable length (B−L0−E) and to be equal to or less than the allowable length (B−L0−E). As a result, the length of each link member 41a to 41c can be significantly enlarged. Therefore, even in the case where the length B in the forward and backward directions of the interface space is relatively small, the robot hand 40 can be extended to a position which is significantly spaced away from the pivot axis A0 on both sides in the left and right directions Y. Thus, even in the case where the number of the FOUP openers 26 is quite increased, the wafer 24 can be carried with the simple link structure as described above. In this embodiment, the first to third link distances L1 to L3 are each set to be the same as the allowable length (B−L0−E). Consequently, interference of the robot arm 41 with the front wall 110 as well as with each FOUP opener 26 can be prevented, and the length of each link member 41a to 41c can be increased to the maximum.

With the increase of the link length of each link member 41a to 41c of the robot arm 41, the movable range of the robot arm 41 can be enlarged with respect to the left and right directions Y. Accordingly, as compared with the second related art, the running means which is adapted to drive the robot 27 to run in the left and right directions Y can be excluded, thus eliminating the direct acting mechanism. As such, occurrence of dust to be associated with the direct acting mechanism can be prevented, and hence degradation of cleanliness in the interface space 29 due to such dust can be avoided. Additionally, the elimination of the running means can ensure downsizing and weight reduction of the robot 27.

In addition, with the increase of the link length of each link member 41a to 41c of the robot arm 41, the robot hand can reach a predetermined position in a wider range. Furthermore, increase of the number of the link members can be controlled, as such simplifying the structure of the robot 27. In addition, redundancy of the robot 27 can be reduced, thus simplifying teaching works concerning control and transformed states for the robot arm 41. Therefore, possibility of collision of the robot arm 41 with the interface space forming portion 28 as well as with each FOUP opener 26 can be reduced.

As described above, in this embodiment, scattering of dust can be suppressed due to exclusion of the running means, as well as, the interference of the robot with the interior of the wafer transfer apparatus 23 can be prevented, as such providing the wafer transfer apparatus 23 comprising the wafer transfer robot 23 which has a significantly simplified structure and can be readily controlled. In addition, the number of the FOUP openers 26 can be increased without enlarging the length B in the forward and backward directions of the interface space 29. With the increase of the number of the FOUP openers 26, carrying, attaching and detaching operations of each FOUP 25 relative to the wafer transfer apparatus 23 and a transfer operation of each wafer contained in each FOUP 25 held by the wafer transfer apparatus 23 can be performed in parallel, thereby to enhance the working efficiency.

Because the length B in the forward and backward directions of the interface space 29 can be reduced, a space for installment of the wafer transfer apparatus 23 can be downsized. Therefore, restrictions regarding the installment space can be lightened, thus in turn facilitating installment of the wafer processing equipment 20. With reduction of the length B in the forward and backward directions of the interface space 29, as compared with a case in which the length B in the forward and backward directions of the interface space 29 is longer, the cleanliness in the interface space 29 can be enhanced as well as the yield can be improved, by using the interface space controller 100 provided with the same function.

In this embodiment, the length B in the forward and backward directions of the interface space can be reduced by designing the robot hand 40 such that the longitudinal direction of the third link member 41c can be inclined relative to the forward and backward directions X in the state wherein the robot hand 40 reaches the corresponding wafer 24. Thus, even in the case where the first and second axis-to-axis distances L11, L12 are set to be shorter in order to prevent interference of the robot hand 40 with the interface space forming portion 28 and/or each FOUP opener 26, holding of the wafer 24, which is held by the FOUP 25 supported by each corresponding FOUP opener, can be performed with ease.

Since the length of each link member 41a to 41c can be increased, as compared with a case in which the length of each link member 41a to 41c is shorter, a transfer speed of the robot hand can be enhanced, even with the angular speed upon angular displacement about the corresponding pivot axes A0 to A2 being the same. By driving both of the first link member 41a and second link member 41b, force of inertia can be reduced. Due to this function, the transfer speed of the robot hand 40 can also be enhanced. With such enhancement of the transfer speed of the robot hand 40, the time required for carrying each wafer 24 can be reduced, thereby to enhance the working efficiency.

Figure 4:
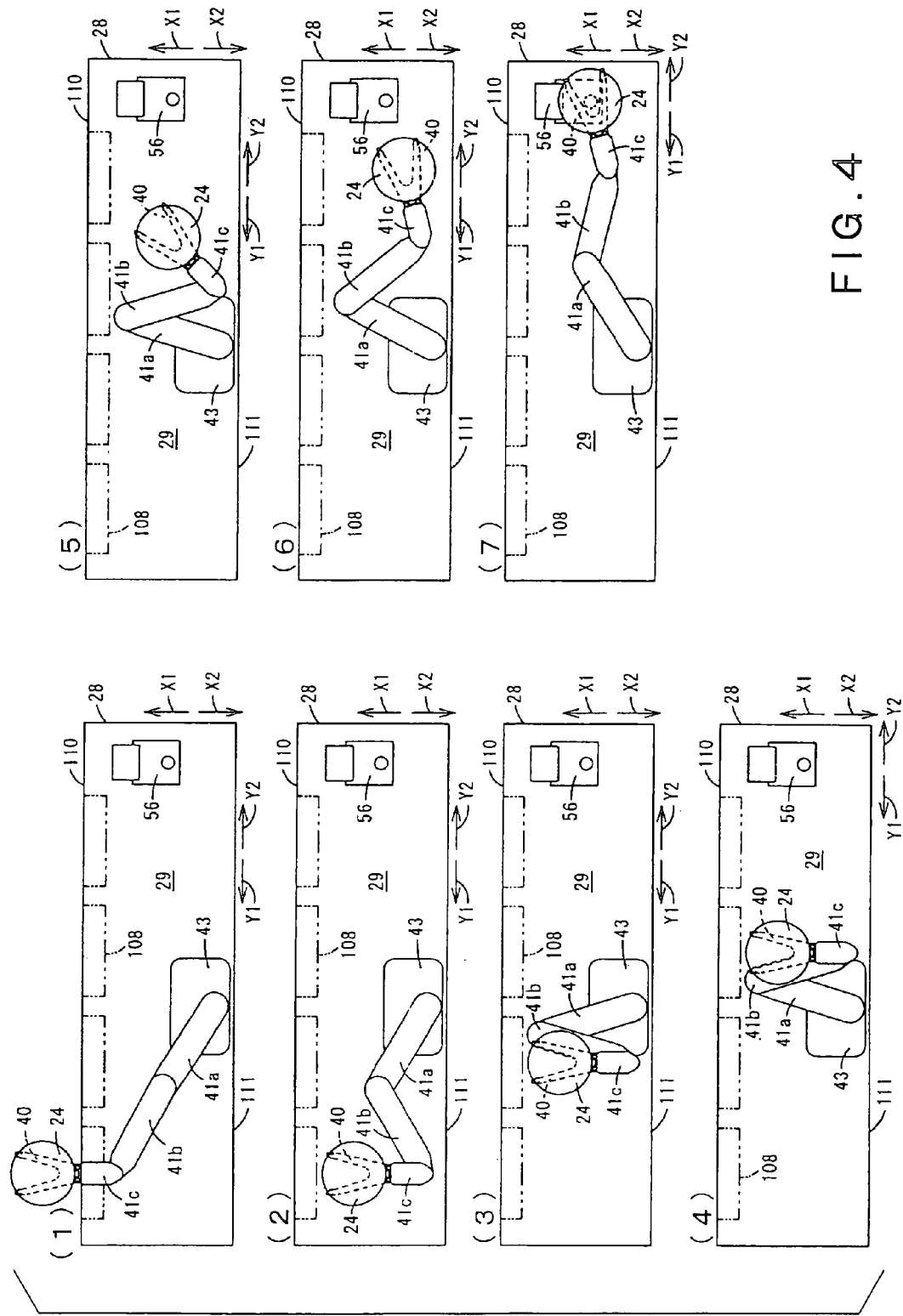
FIG. 4 is a diagram showing a carrying operation, which is simplified, for carrying a wafer 24 contained in a first FOUP 25a to an aligner 56.

FIG. 4 is a diagram showing a carrying operation, which is simplified, for carrying the wafer 24 contained in the first FOUP 25a to the aligner 56. The carrying operation proceeds in the order of from FIG. 4(1) to FIG. 4(7). The carrying operation shown in FIG. 4 is stored in the controller 44, with respect to the transfer route and passing through points of the robot hand 40. The controller 44 serves to control the horizontal drive means 42a and the vertical drive means 42b by executing a predetermined operational program, such that the robot hand 40 passes through a plurality of points along the transfer route. Consequently, the wafer transfer robot 27 can carry each wafer 24 contained in the first FOUP 25a to the aligner 56.

First, the robot arm 41 is moved vertically up to the wafer 24 to be held, and then transformed such that the first link member 41a and the second link member 41b are extended in a straight line, as shown in FIG. 4(1), so as to hold the wafer 24 contained in the first FOUP 25a by using the hand 40. Next, as shown in FIG. 4(2), the first link member 41a and the second link member 41b are angularly displaced about the corresponding angular displacement axes A0, A1, respectively, so as to move the third link member 41c in the backward direction X2 into the interface space 29 together with the wafer 24.

Subsequently, the first link member 41a and the second link member 41b are further angularly displaced about the corresponding angular displacement axes A0, A1, respectively, so as to move the third link member 41c in parallel to the left and right directions Y, toward the aligner 56 located in a position far away from the first FOUP opener 26a in the left and right directions Y. At this time, because the first axis-to-axis distance L11 and the second axis-to-axis distance L12 are set to be equal, as shown in FIGS. 4(3) and 4(4), the second link member 41b is angularly displaced about the first joint axis A1, in an amount of angular displacement per unit time, which is twice the amount of angular displacement per unit time, relative to the angular displacement of the first link member 41a about the pivot axis A0. In this manner, the third link member 41c can be moved in parallel to the left and right directions Y, without angularly displacing the third link member 41c about the second joint axis A2, and without altering the attitude of the third link member 41c.

In the case of locating the third link member 41c on the aligner 56 with its attitude altered, as shown in FIGS. 4(5) to 4(7), the wafer 24 can be located in a holding position set in the aligner 56, by angularly displacing the first to third link members 41a to 41c about the corresponding angular displacement axes A0 to A2, respectively. In order to enable the aligner 56 to hold the wafer 24, after the robot arm 41 has held the wafer 24 and by the time it carries the wafer 24 to the aligner 56 so as to make the aligner 56 hold the wafer 24, the position in the upward and downward directions of the robot arm 41 is adjusted by the vertical drive means 42b. In this manner, the wafer transfer robot 27 can carry the wafer 24, which has been contained in the first FOUP 25a, to the aligner 56.

Figure 5:
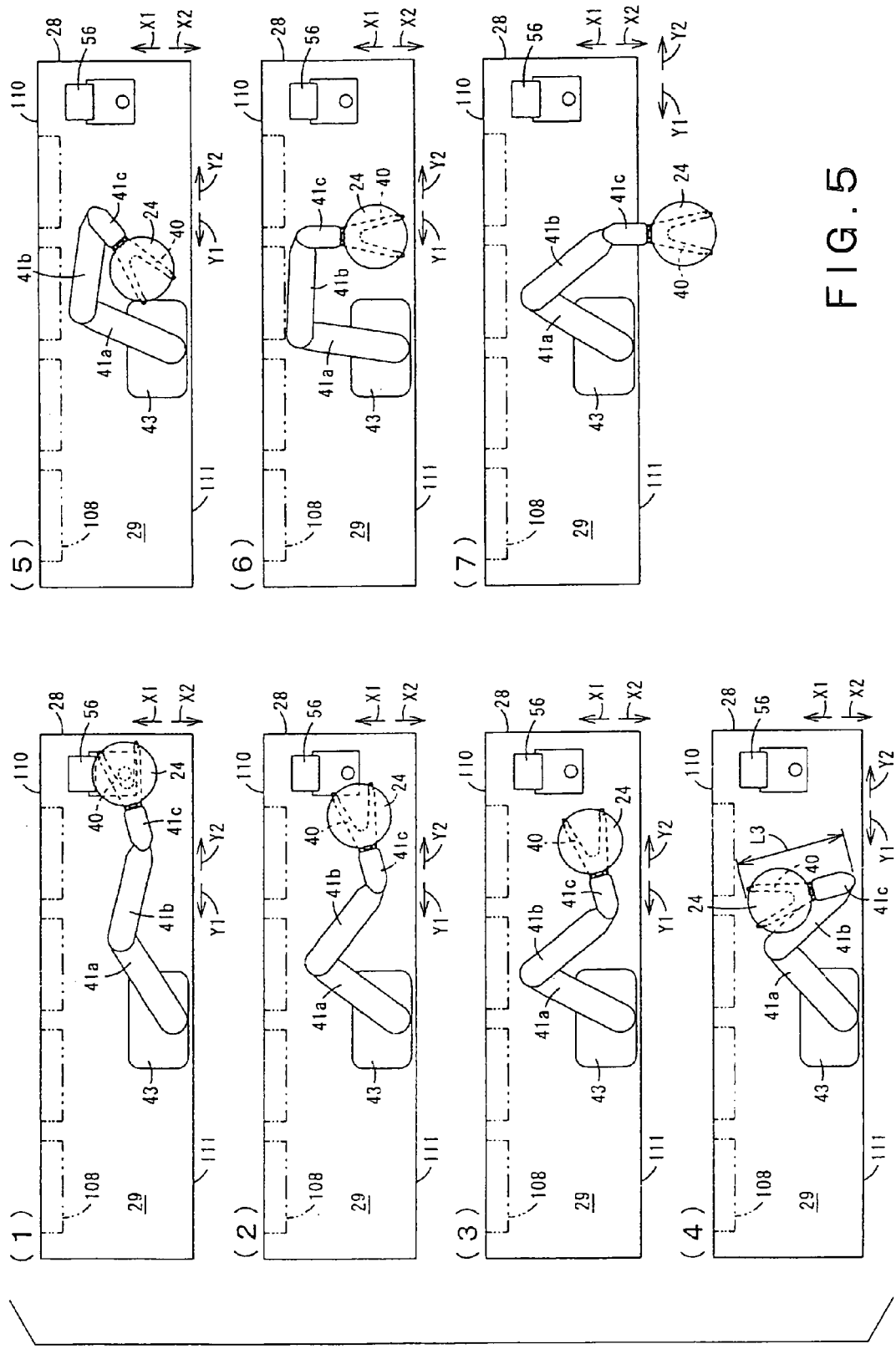
FIG. 5 is a diagram showing a carrying operation, which is simplified, for carrying the wafer 24 supported by the aligner 56 to a processing space 30.

FIG. 5 is a diagram showing a carrying operation, which is simplified, for carrying the wafer 24 supported by the aligner 56 into the processing space 30. The carrying operation proceeds in the order of from FIG. 5(1) to FIG. 5(7). Similar to the case shown in FIG. 4, the wafer transfer robot 27 can carry the wafer 24 held by the aligner 56 into the processing space 30, by controlling the horizontal drive means 42a and the vertical drive means 42b in accordance with the predetermined program.

In the case of carrying the wafer 24 into the processing space 30, the hand 40 should be directed in the backward direction X2. Accordingly, as shown in FIG. 5(1), from a state wherein the second joint axis A2 has been moved in the backward direction X2 in the interface space 29 while the third link member 41c holding the wafer 24, the third link member 41c is angularly displaced about the second joint axis A2 as well as the second joint axis A2 is moved in the forward direction X1 in the interface space 29. In the example shown in FIG. 5, after the third link member 41c has been angularly displaced by about 120 degrees, the second joint axis A2 is moved in the forward direction X1 in the interface space 29, and the third link member 41c is then further angularly displaced.

Thus, the orientation of the third link member 41a can be altered by 180 degrees in the interface space 29 without any interference of the third link member 41a with the front wall 110, rear wall 111 and each FOUP opener 26. Accordingly, as shown in FIGS. 5(2) to 5(6), after the orientation of the third link member 41c has been altered, as shown in FIG. 5(7), the wafer 24 can be carried into the processing space 30. In order to enable the robot arm 41 to be moved into the processing space 30 after it has held the wafer 24 and by the time it is moved toward the processing space 30, the position in the upward and downward directions of the robot arm 41 is controlled by the vertical drive means 42b. In this way, the wafer transfer robot 27 can carry the wafer 24, which has been held by the aligner 56, into the processing space 30.

Figure 6:
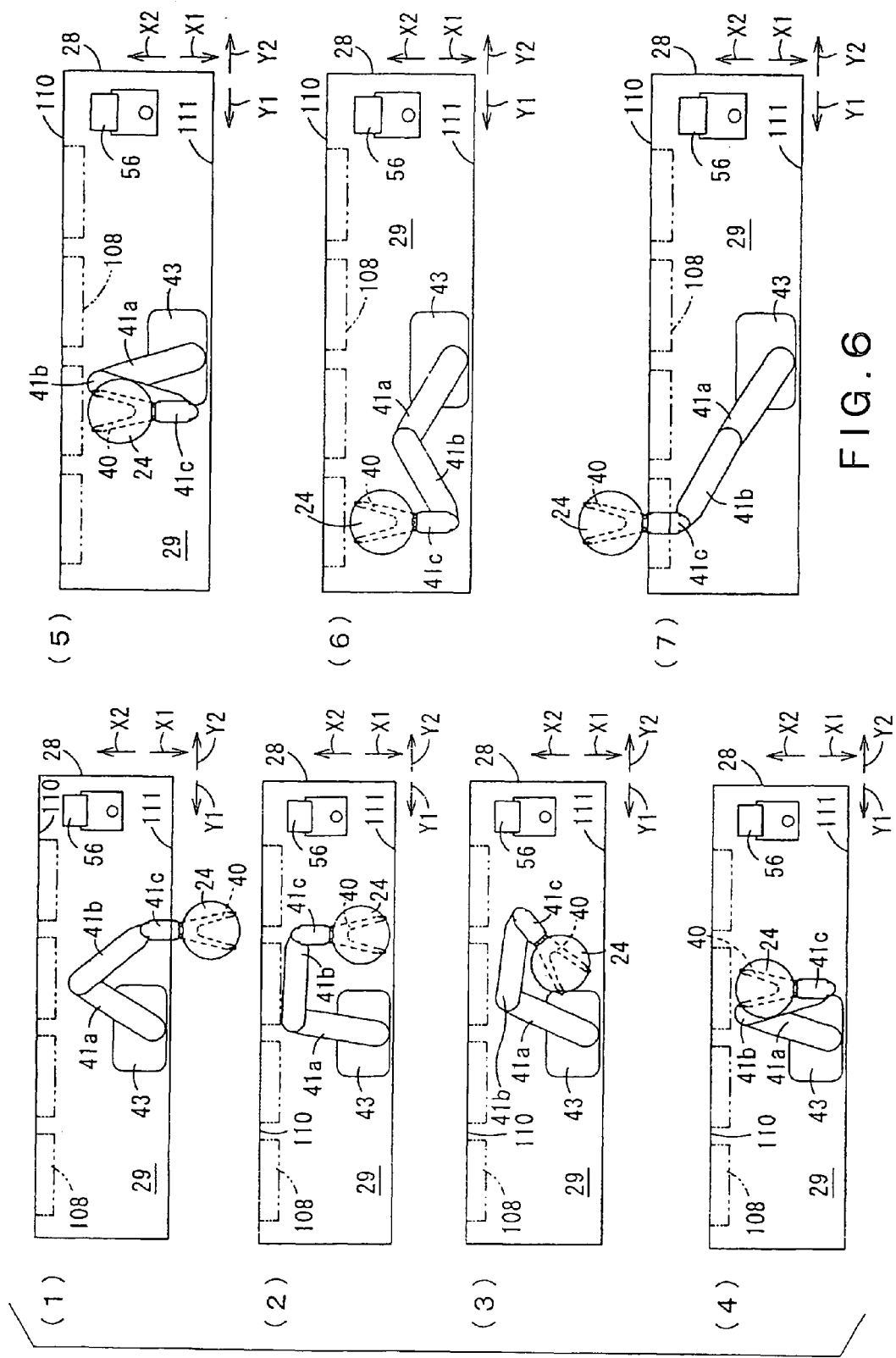

FIG. 6 is a diagram showing a carrying operation, which is simplified, for carrying the wafer 24 located in the processing space 30 to the first FOUP 25a. Similar to the case shown in FIG. 4, the controller controls the horizontal drive means 42a and the vertical drive means 42b in accordance with the predetermined program so that the wafer transfer robot 27 can carry the wafer 24 contained in the processing space 30 to the first FOUP 25a.

First, the robot arm 41 is moved upward and downward to a position of the wafer 24 to be held as well as the robot arm 41 is transformed, as shown in FIG. 6(1), so as to hold the wafer 24 in the processing space 30. Subsequently, as shown in FIG. 6(2), the first link member 41a and the second link member 41b are angularly displaced about the corresponding angular displacement axes A0, A1, respectively, and the third link member 41c is moved in the forward direction X1, so as to move the third link member 41c and the wafer 24 into the interior of the interface space 29. Thereafter, as shown in FIGS. 6(3) and 6(4), while the position of the second joint axis A2 is adjusted in order to prevent interference due to the third link member 41c, the third link member 41c is rotated about the second joint axis A2 to alter its attitude, thus changing the orientation of the third link member 41c. Next, as shown in FIGS. 6(4) and 6(5), the first link member 41a and the second link member 41b are angularly displaced about the corresponding angular displacement axes A0, A1, respectively, so as to move the third link member 41c in parallel to the left and right directions Y. Thereafter, as shown in FIG. 6(6), a portion on the robot hand side of the third link member 41c is positioned to face the front opening as well as maintained in an attitude which is substantially parallel to the forward and backward directions X. In this state, the position of the hand 40 in the upward and backward directions is adjusted to enable the wafer to be contained in the FOUP. As such, the wafer is contained in the space in the FOUP 25 as shown in FIG. 6(7).

Figure 7:
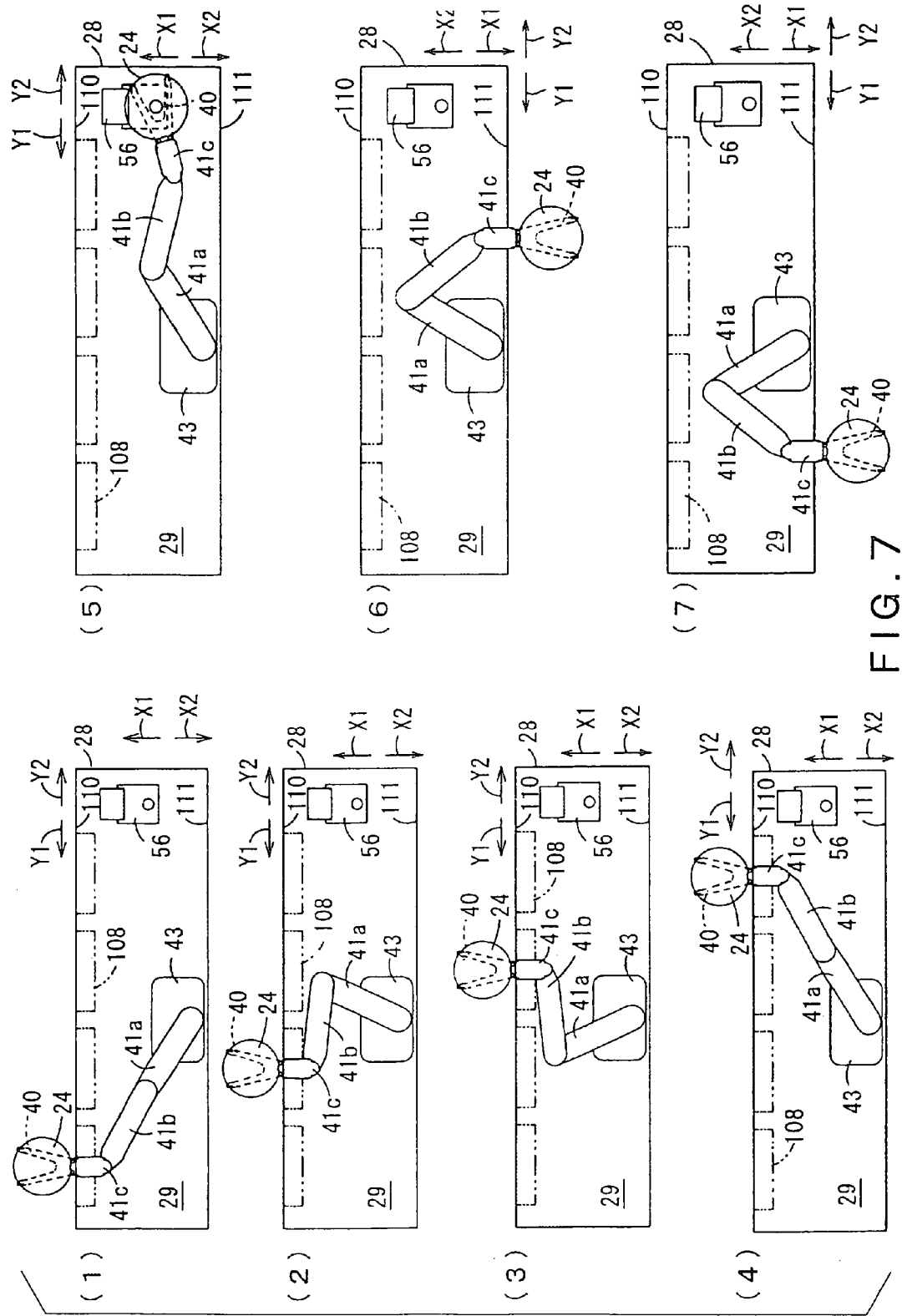
FIG. 7 is a diagram showing a state in which the wafer 24 is located in its receiving and transferring positions of the embodiment according to the present invention.

FIG. 7 is a diagram showing a state in which the wafer 24 is located in its receiving and transferring positions of the embodiment according to the present invention. FIGS. 7(1) to 7(4) depict states wherein the wafers 24 contained in the first to fourth FOUPs 25a to 25d are held, respectively. FIG. 7(5) shows a state in which the wafer 24 is located at the aligner 56. FIGS. 7(6) and 7(7) show states wherein the wafer 24 is located in positions set in the processing space 30, respectively. As illustrated, this embodiment can be configured to include the robot arm having the three-link type structure so as to enable receiving and transferring of the wafers 24 in the FOUPs 25 supported by the four FOUP openers 26a to 26d, respectively.

While, this embodiment comprises the single third link member 41c provided in the robot hand 40, it is not limited to this aspect. Namely, in the present invention, it is also contemplated that a plurality of, for example, two, third link members 41c may be provided.

For example, in the case where a plurality of third link members 41c are provided, these third link members 41c are provided to be arranged in the upward and downward directions Z, respectively. Each third link member 41c is connected, at its one end 45c in the longitudinal direction, with the other end 46b in the longitudinal direction of the second link member 41b. Each third link member 41c is configured such that it can be angularly displaced, individually, about the second joint axis A2 relative to the second link member 41b. In addition, each third link member 41c is provided with the robot hand 40 formed at the other end thereof in the longitudinal direction. Due to arrangement of each third link member 41c in a region different in the upward and downward directions, even though they are angularly displaced, individually, about the second joint axis A2, mutual interference between the third link members 41c can be prevented. In addition, due to such provision of the plurality of third link members 41c, the number of sheets of the wafers that can be carried at a time can be increased, as such enhancing the working efficiency. It should be appreciated that the number of the third link members is not limited to one or two but three or more third link members 41c may be provided. It is preferred that each third link member 41c is formed to have the same shape.

Figure 8:
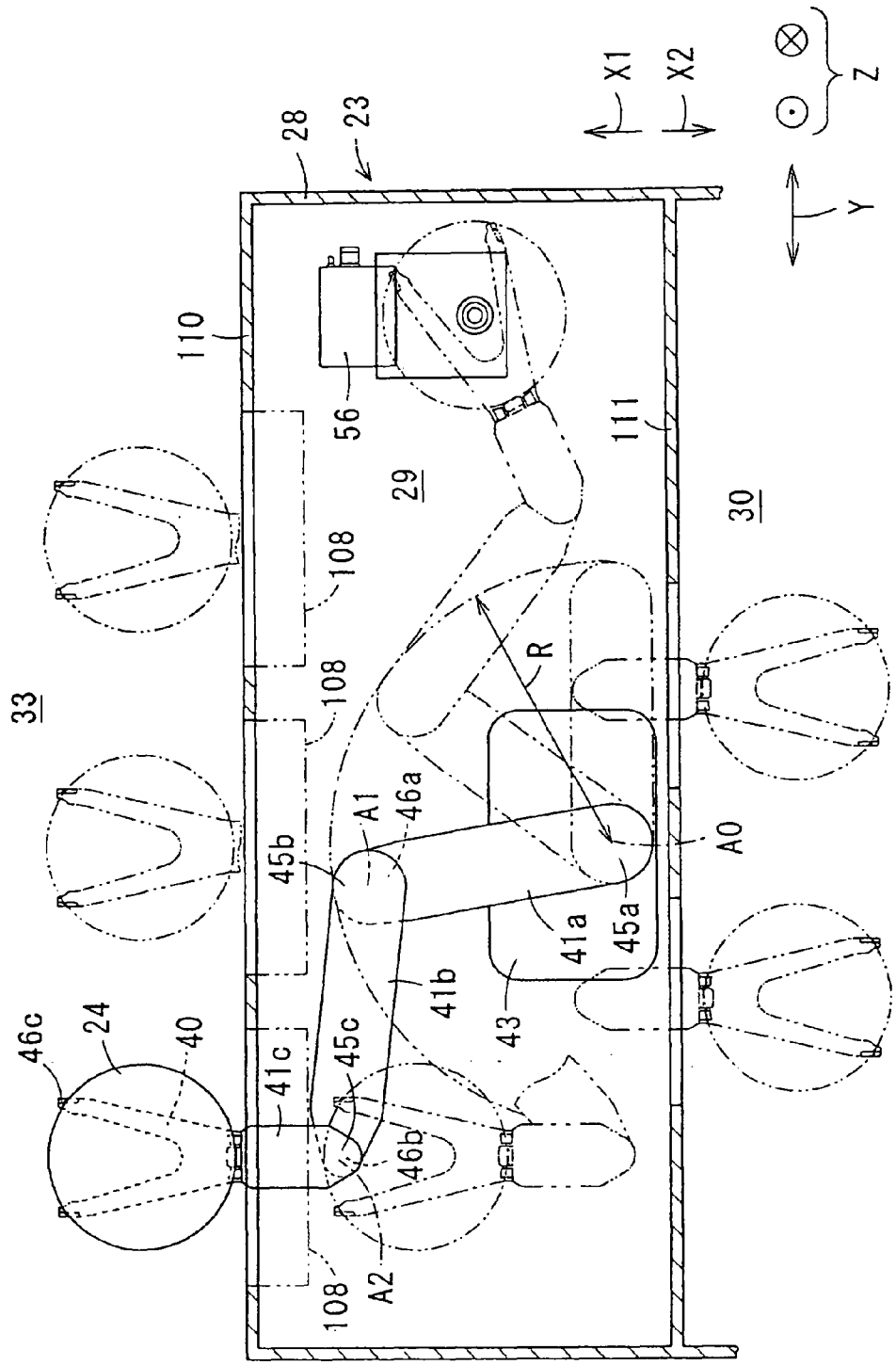
FIG. 8 is a plan view showing the wafer transfer apparatus in the case that there are three FOUP openers.
Figure 9:
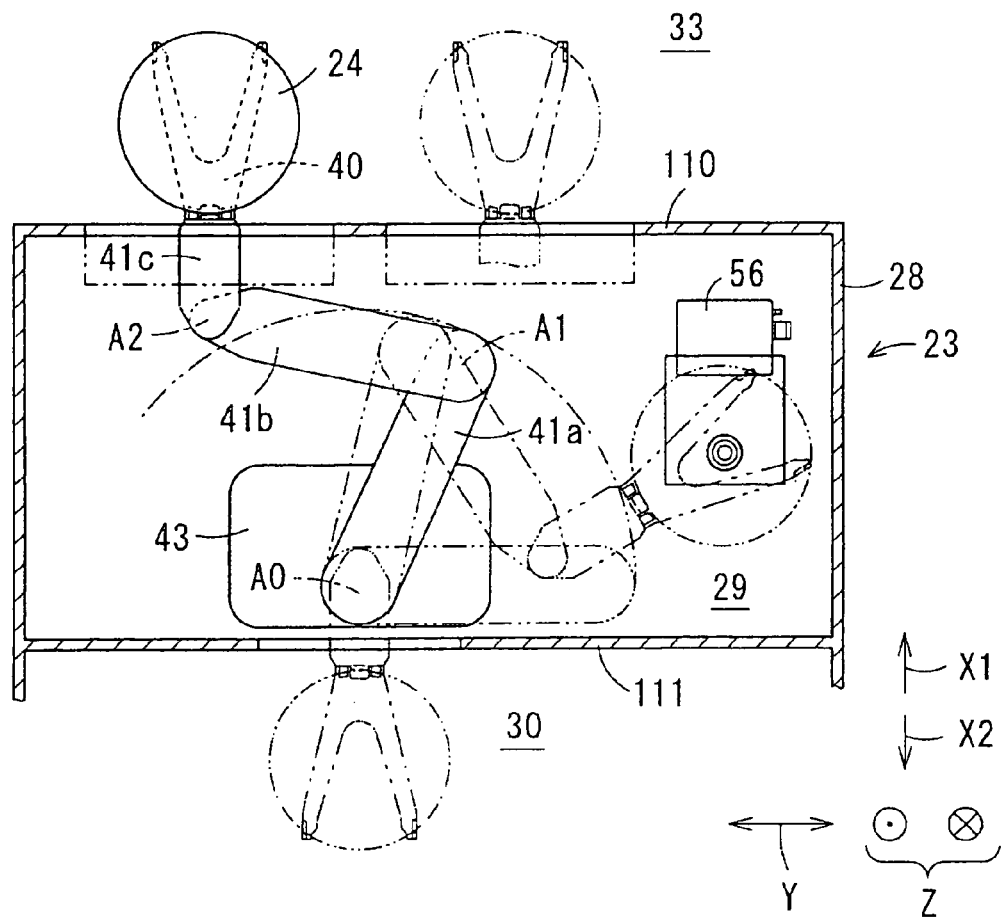
FIG. 9 is a plan view showing the wafer transfer apparatus in the case that there are two FOUP openers.

FIG. 8 is a plan view showing the wafer transfer apparatus 23 including three FOUP openers 26. FIG. 9 is a plan view showing the wafer transfer apparatus 23 including two FOUP openers 26. In FIGS. 8 and 9, one example of additional working forms of a robot 27 is depicted by chain double-dashed lines. The wafer transfer robot 27 shown in FIGS. 8 and 9 is configured similarly to the wafer transfer robot 27 used in the wafer transfer apparatus 23 including the four FOUP openers 26. Accordingly, the wafer transfer robot 27 can carry each wafer without causing any interference with the front wall 110 and the rear wall 111, also in the case of including the two or three FOUP openers 26. As such, there is no need for changing the configuration of the robot depending on the number of the FOUP openers 26, thereby to enhance applicability for general purposes.

Figure 10:
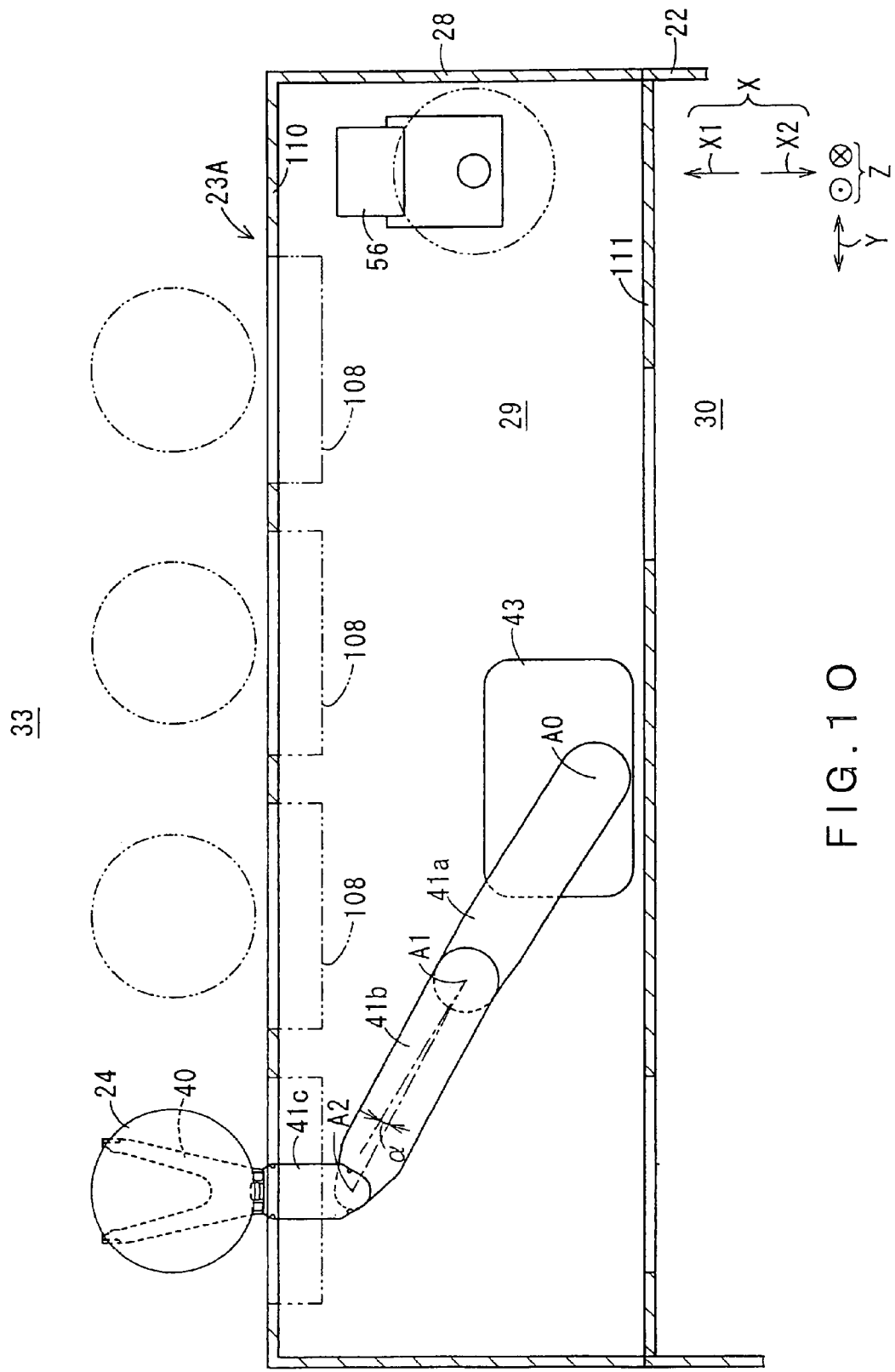
FIG. 10 is a plan view showing a wafer transfer apparatus 23A, which is a second embodiment of the present invention and is somewhat simplified.

FIG. 10 is a plan view showing a wafer transfer apparatus 23A which is a second embodiment of the present invention, and is somewhat simplified. The wafer transfer apparatus 23A of the second embodiment includes portions similar to those in the wafer transfer apparatus 23 of the first embodiment described above. Thus, such like parts are not described here, and designated by like reference numerals. Specifically, the wafer transfer apparatus 23A of the second embodiment is different from the first embodiment in the length of the wafer transfer robot 27, but is the same as the first embodiment in regard to the other configuration.

The first embodiment is configured such that the robot hand 40 reaches the wafer 24 contained in the first FOUP 25a with the first link member 41a and the second link 41b extended together in a straight line. However, the present invention is not limited to this aspect. Namely, in the second embodiment, the robot hand 40 reaches the wafer 24 contained in the first FOUP 25a with the longitudinal direction of the link member 41a and the longitudinal direction of the second link member 41b defining a predetermined angle $\alpha$.

In the second embodiment, angular positions of the first link member 41a and the second link member 41b are respectively set such that the robot hand 40 reaches the wafer 24, with the longitudinal direction of the third link member 41c being coincident with the forward and backward directions X. Namely, in the second embodiment, the hand 40 reaches the wafer 24, with the longitudinal direction of the third link member 41c being coincident with the forward and backward directions X, and the third link member 41c is then moved in parallel to the backward direction X2, so as to carry the wafer 24 into the interface space 29. Thus, even in the case where a gap between the wafer held by the hand 40 and the front opening 101a as well as the opening 60a of the FOUP main body 60 is relatively small, collision of the wafer 24 with each opening 101a, 60a can be prevented.

Also in the second embodiment, by locating the pivot axis A0 near the rear wall 111 and by setting the minimum rotation radius R of the robot arm 41 to exceed ½ of the subtracted value (B−L0) described above and to be equal to or less than the subtracted value (B−L0), the same effect as in the first embodiment can be obtained.

Figure 11:
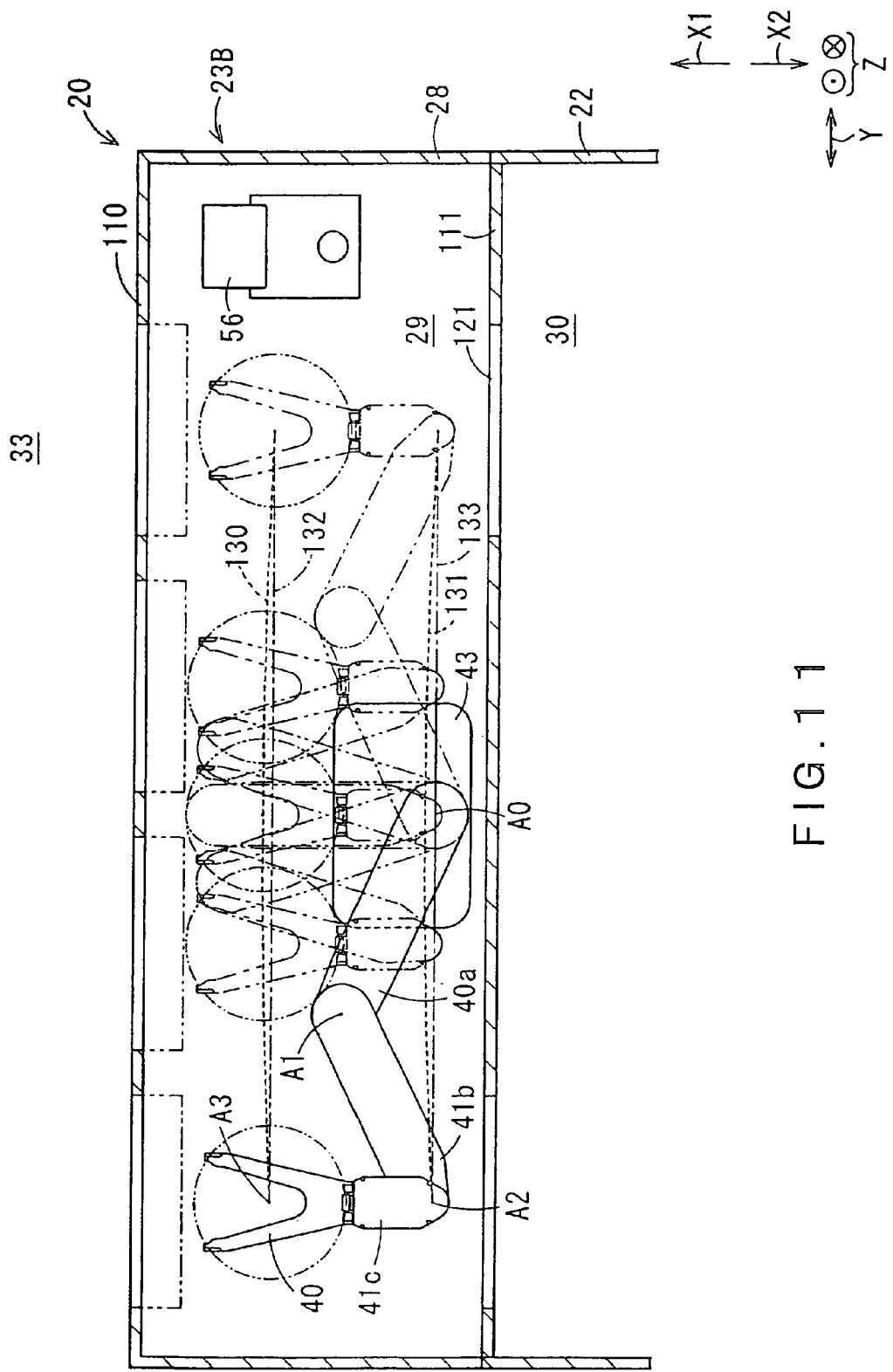
FIG. 11 is a plan view showing a wafer transfer apparatus 23B, which is a third embodiment of the present invention and is somewhat simplified.

FIG. 11 is a plan view showing a wafer transfer apparatus 23B which is a third embodiment of the present invention, and is somewhat simplified. In FIG. 11, one example of additional working forms of a robot 27 is depicted by chain double-dashed lines. The wafer transfer apparatus 23B of the third embodiment includes portions similar to those in the wafer transfer apparatus 23 of the first embodiment described above. Thus such like parts are not described here, and designated by like reference numerals. Specifically, the wafer transfer apparatus 23B of the third embodiment is different from the first embodiment in the length of the wafer transfer robot 27, but is the same as the first embodiment in regard to the other configuration.

In the first embodiment, the first axis-to-axis distance L11 and the second axis-to-axis distance L12 are of the same length. However, this invention is not limited to this aspect. In the third embodiment, there is some difference in the length between the first axis-to-axis distance L11 and the second axis-to-axis distance L12, and the first axis-to-axis distance L11 is provided to be slightly longer than the second axis-to-axis distance L12. In this case, as shown in FIG. 11, when angularly displacing the second link member 41b about the first joint axis A1, in an amount of angular displacement per unit time, which is twice the amount of angular displacement per unit time, relative to the angular displacement of the first link member 41a about the pivot axis A0 while the angular displacement of the third link member 41c about the second joint axis A2 is stopped, the attitude of the third link member 41c is changed slightly.

When the robot hand 40 is advanced from one end to the other end in the left and right directions Y relative to the pivot axis A0, transfer tracks 130, 131 of the central position A3 of the wafer 24 held by the hand 40 and the second joint axis A2 depict circular arcs both being convex in the forward direction X, respectively. In FIG. 11, in order to facilitate understanding, the transfer tracks 130, 131 of the central position A3 and the second joint axis A2 are respectively depicted by dashed lines, while corresponding imaginary lines 132, 133 extending in parallel with the left and right directions Y are respectively expressed by chain lines.

In this case, when the difference in the length between the first axis-to-axis distance L11 and the second axis-to-axis distance L12 is quite small, the third link member 41c can be moved in substantially parallel to the left and right directions Y. In such a manner, the first axis-to-axis distance L11 and the second axis-to-axis distance L12 may be provided with slight alteration. For example, an acceptable difference in the length between the first axis-to-axis distance L1 and the second axis-to-axis distance L12 may be set within (B−L0−E−L1) mm.

Also in the third embodiment described above, by locating the pivot axis A0 near the rear wall 111 and by setting the minimum rotation radius R of the robot arm 41 to exceed ½ of the subtracted value (B−L0) described above and to be equal to or less than the subtracted value (B−L0), the same effect as in the first embodiment can be obtained. The length of each link member 41a to 41c of the robot arm 41 and each axis-to-axis distance L11, L12 of the first to third embodiments are described by way of example, and hence may be altered. For example, the first link distance L1, second link distance L2 and third link distance L3 may not necessarily be the same.

Figure 12:
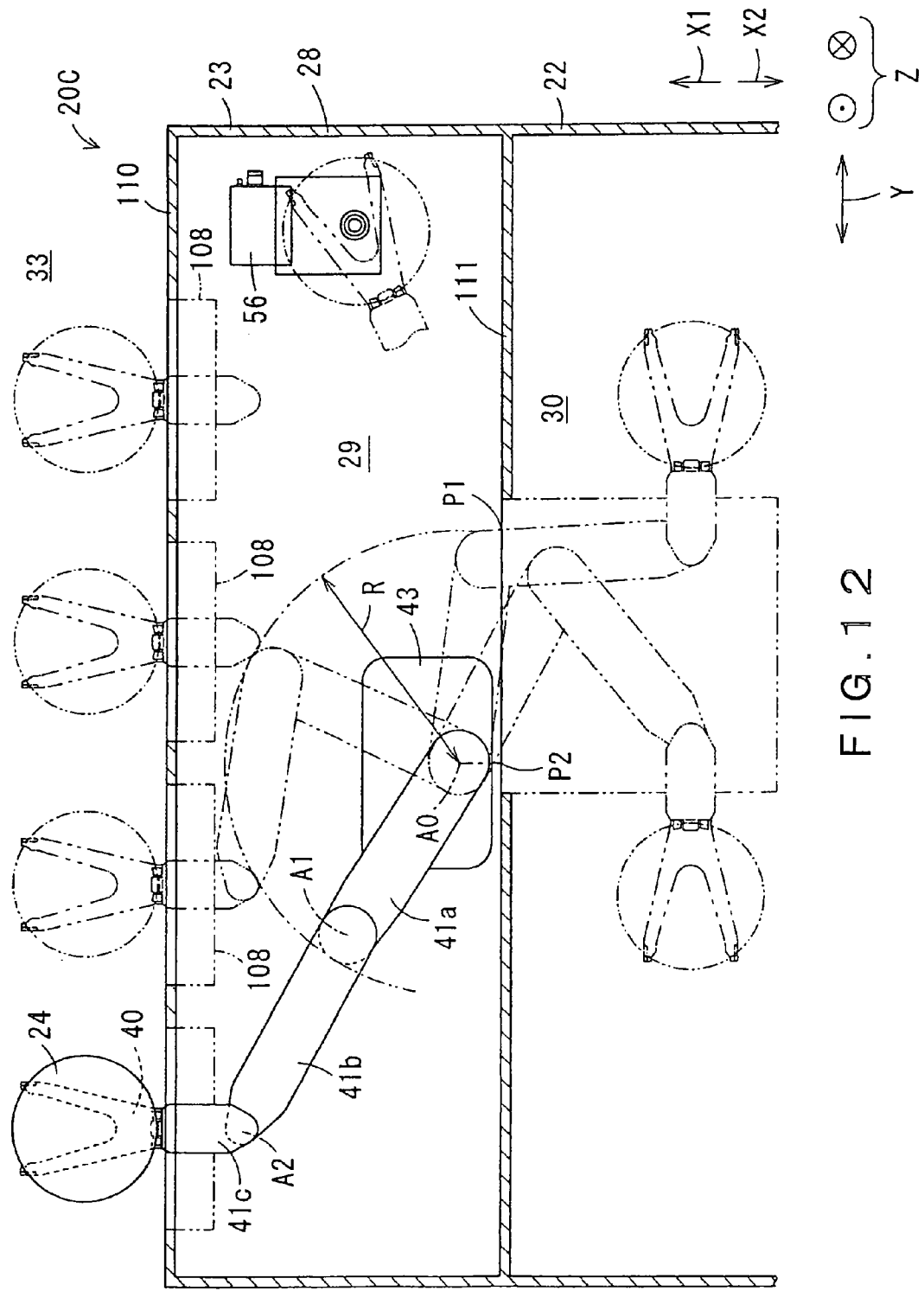
FIG. 12 is a plan view showing a semiconductor processing apparatus 20C which is a fourth embodiment of the present invention.
Figure 13:
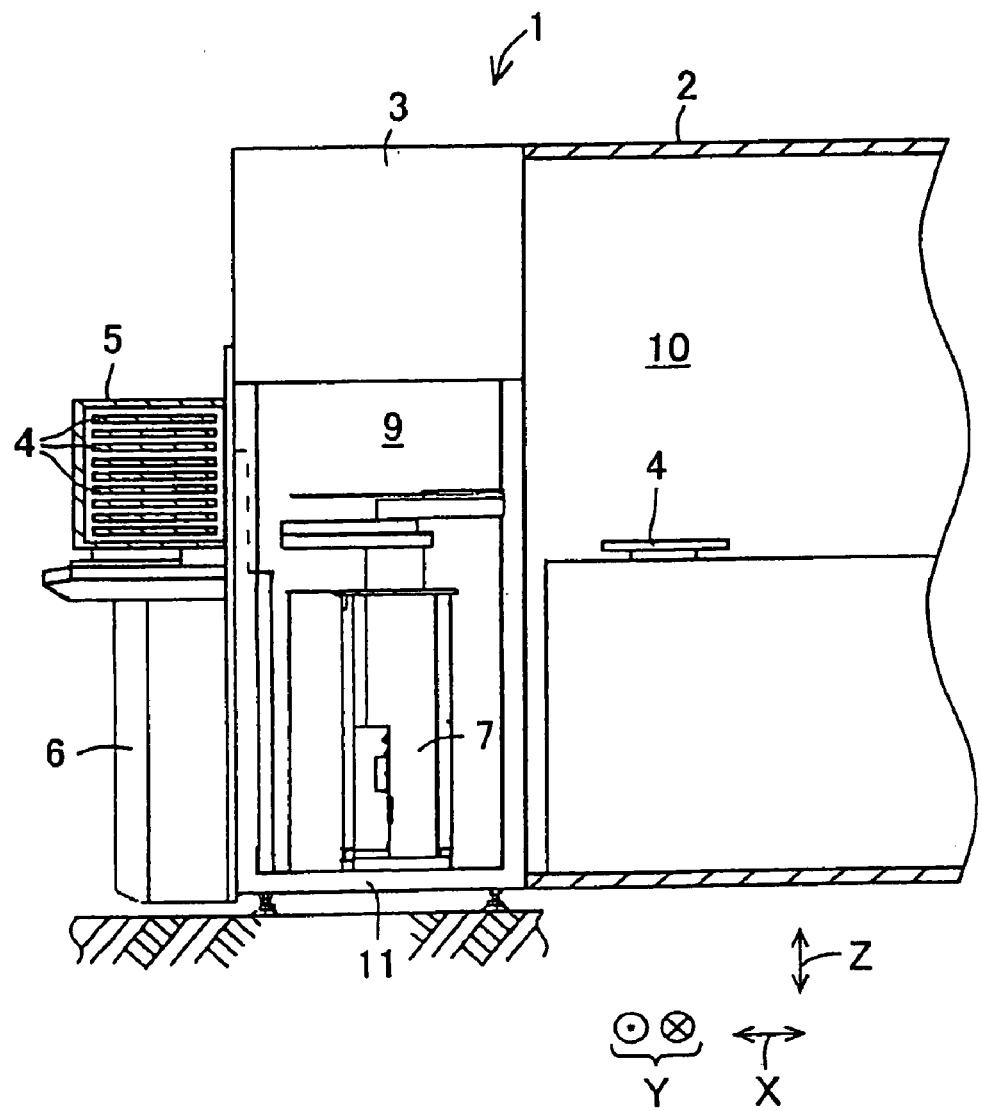
FIG. 13 is a section showing a semiconductor processing equipment 1 of the related art, which is partly cut away.
Figure 14:
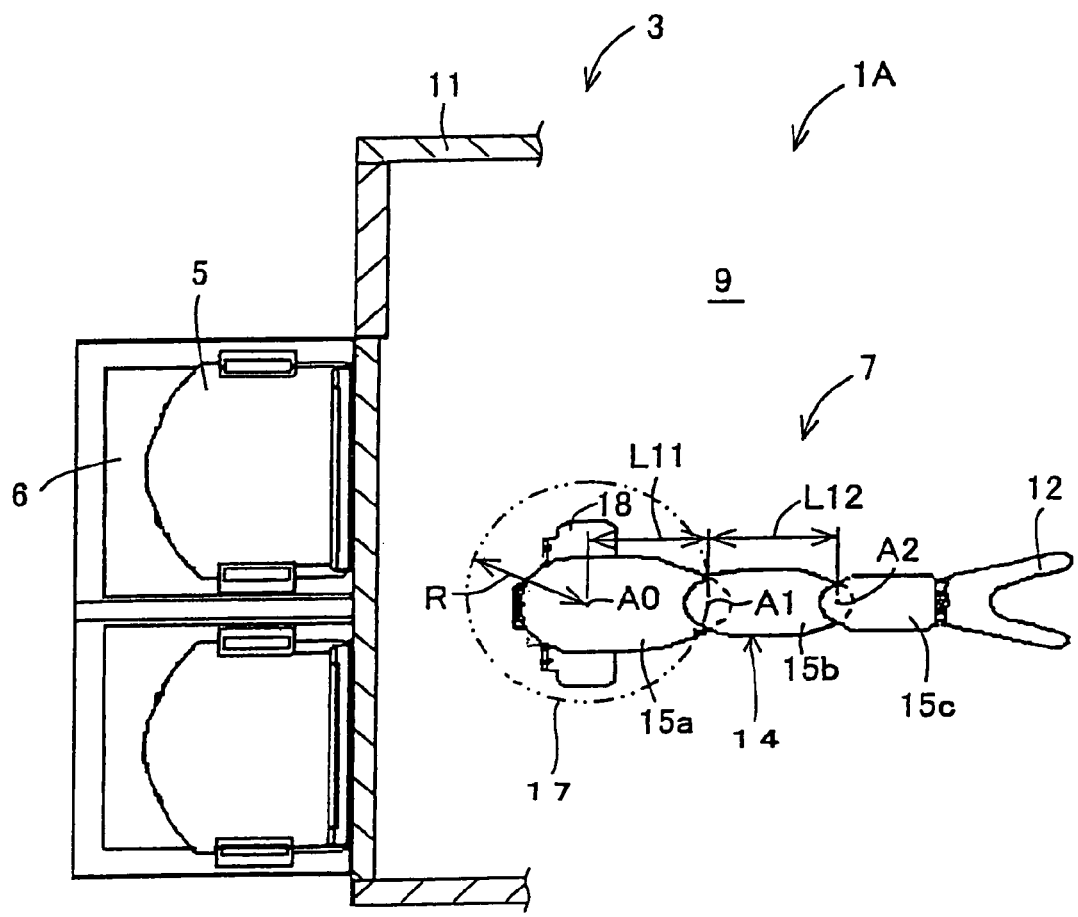
FIG. 14 is a plan view showing a semiconductor processing equipment 1A of a first related art, which is partly cut away.
Figure 15:
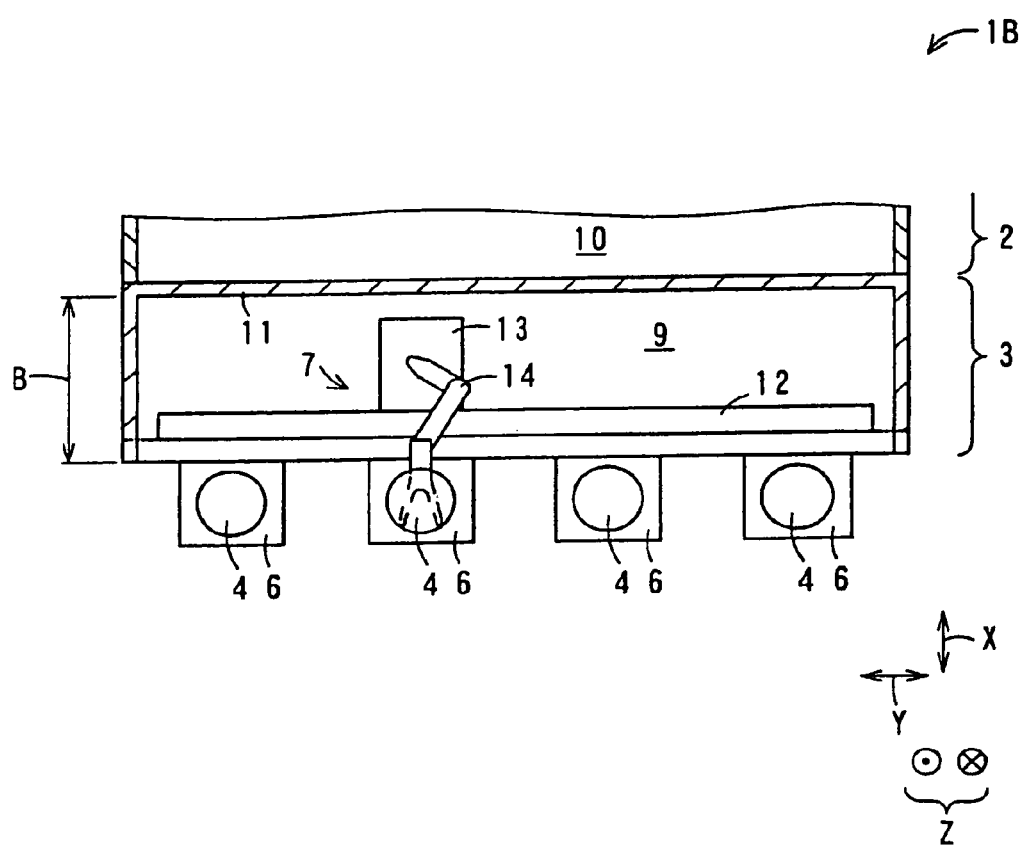
FIG. 15 is a plan view showing a semiconductor processing equipment 1B of a second related art, which is partly cut away.

FIG. 12 is a plan view showing a part of semiconductor processing equipment 20C which is a fourth embodiment of the present invention. The semiconductor processing equipment 20C of the fourth embodiment includes portions similar to those in the wafer transfer apparatus 23 of the first embodiment described above. Thus such like parts are not described here, and designated by like reference numerals. In the semiconductor processing equipment 20c of the fourth embodiment, the wafer transfer robot 27 of the wafer transfer apparatus 23 also serves as a carrier provided in the wafer processing apparatus 22. In regard to the other configuration, the semiconductor processing equipment 20c is the same as the first embodiment. As such, descriptions on that point are omitted here.

In the first embodiment, the carrier included in the wafer processing apparatus 22 receives the wafer 24 to be carried into the processing space 30 from the interface space 29 by the wafer transfer apparatus 23, and then carries the received wafer 24 into the wafer processing position. On the other hand, in the fourth embodiment, since the wafer transfer robot 27 of the wafer transfer apparatus 23 can extend its operational region as shown in FIG. 12, it can transfer the wafer not only in the wafer transfer apparatus 23, but can also be advanced into the processing space 30 of the wafer processing apparatus 22 so as to directly transfer the wafer 24 to the wafer processing position. Accordingly, there is no need for a carrier in the wafer processing apparatus 22, thus reducing the number of elements in the wafer processing equipment, thereby reducing the production cost.

In the fourth embodiment, it is preferred that the rear opening 121 is provided in the vicinity of the pivot axis A0 with respect to the left and right directions Y. It is also preferred that the rear opening 121 is formed to have a space extending longer than a distance between a first crossing point P1 that is one of two crossing points, at which an imaginary circle defined to make a circuit around the pivot axis A0, with its radius being the minimum rotation radius R of the robot 27, crosses the rear-face-side wall 111 and a second point P2, at which a line passing through the pivot axis A0 and extending in the forward and backward directions X crosses the rear-face-side wall 111, as such the space is shaped to include both of the first crossing point P1 and the second crossing point P2. Consequently, in the case of angularly displacing the first link member 41a about the pivot axis A0, interference of the first link member 41a with the rear-face-side wall 111 can be prevented. Thus, the first joint axis A1 set in the first link member 41a can be located also in the processing space 30. Accordingly, the wafer 24 can be transferred to a position away from the rear wall 111 in the backward direction X2 in the processing space 30.

Each of the embodiments 1 to 4 described above is illustrated by way of example, and of course may be modified within the scope of this invention. For example, while in these embodiments, the wafer transfer apparatus 23 used in the wafer processing equipment 20 has been described, a processing transfer apparatus for use in semiconductor processing equipment for processing substrates other than semiconductor wafers may also be included in the scope of the present invention. In this case, the substrate transfer apparatus can be generally applied to those configured to transfer each substrate from a substrate container to a substrate processing apparatus through an interface space in which an atmospheric gas is properly controlled, as well as carry the substrate from the substrate processing apparatus to the substrate container through the interface space. For example, as the substrate, semiconductor substrates and glass substrates may be mentioned. While the wafer has been described on the assumption that has a 300 mm size, the robot arm may be modified to have other link sizes in order to be applied to wafers of other sizes.

In each of the embodiments described above, while the wafer transfer apparatus 23 includes the aligner 56, it may includes another processing device than the aligner 56. This processing device is adapted to hold each wafer in the interface space 29 and perform predetermined processes and operations. For example, as the processing device, a buffer member adapted to hold each wafer 24 in the interface space 29 or an inspection device adapted to hold the wafer in the interface space 29 and inspect it about quality and presence of defects. It should be noted that the wafer transfer apparatus 23 not including the processing device, such as the aligner 56, may also be included in the scope of the present invention.

In the case where it is necessary to transfer each wafer 24 over a wider region in the left and right directions in order to carry the wafer to the processing device even though only three or less FOUP openers are used, the application of this invention enables advantageous wafer transfer, even with the length B in the left and right directions of the interface space being significantly small. In this case, each position arranged in the left and right directions relative to the pivot axis A0 is determined appropriately, depending on positions of respective objects to be moved in the left and right directions. In place of using the FOUP openers, substrate container setting tables may be provided for setting substrate containers.

In this embodiment, while the first link member 41a has been described to be able to angularly displace by 90° in one and the other directions about the pivot axis A0 relative to the reference line P0 passing through the pivot axis A0 and extending in the forward and backward directions X, the operation of the first link member 41a is not limited to this mode. Additionally, in this embodiment, while the expressions of the forward and backward directions X, left and right directions Y and upward and downward directions Z have been used, for example, first directions, second directions and third directions or the like, which are orthogonal to one another, may be employed as alternatives.

Although the invention has been described in its preferred embodiments with a certain degree of particularity, obviously many changes and variations are possible therein. It is therefore to be understood that the present invention may be practiced otherwise than as specifically described herein without departing from the scope and spirit thereof.

What is claimed is:

1. A wafer transfer apparatus for transferring a wafer, comprising:
   an interface space forming portion defining an interface space, the interface space forming portion having a front wall and a rear wall which are arranged at a predetermined interval in forward and backward directions, the front wall having a front opening formed therein, and the rear wall having a rear opening formed therein;
   a FOUP opener configured to open and close the substrate container located adjacent to the interface space and the front opening of the interface space forming portion; and
   a wafer carrying robot located in the interface space and configured to carry the wafer between the front opening and the rear opening,
   wherein the wafer carrying robot includes:
      a base which is fixed to the interface space forming portion and at which a predetermined pivot axis is set;
      a robot arm having a proximal end and a distal end, the robot arm including a plurality of link members connected with one another in succession in a direction from the proximal end to the distal end, the proximal end being connected with the base, the distal end being provided with a robot hand for holding the wafer, the robot arm being configured to be angularly displaced about the pivot axis; and
      a drive unit configured to drive each of the link members of the robot arm so that the link members are angularly displaced, individually, about each corresponding axis,
   wherein, in a minimum transformed state where the robot arm is transformed such that a distance defined from the pivot axis to an arm portion which is farthest in a radial direction relative to the pivot axis is minimum, a minimum rotation radius R, as the distance defined from the pivot axis to the arm portion which is the farthest in the radial direction relative to the pivot axis, is set to exceed ½ of a length B in the forward and backward directions of the interface space, the length B corresponding to a length between the front wall and the rear wall of the interface space forming portion, and is further set to be equal to or less than a subtracted value (B−L0) to be obtained by subtracting a distance L0 in the forward and backward directions from the rear wall of the interface space forming portion to the pivot axis, from the length B in the forward and backward directions of the interface space (i.e., B/2<R≦B−L0), and
   the minimum rotation radius R is set to be equal to or less than an allowable length (B−L0−E) to be obtained by subtracting the distance L0 in the forward and backward directions from the rear wall of the interface space forming portion to the pivot axis and a length E of a robot invasion restricted region, which is set for the FOUP opener and is measured from the front wall in the forward and backward directions toward the rear wall, from the length B in the forward and backward directions of the interface space (i.e., R<B−L0−E).

2. The wafer transfer apparatus according to claim 1, wherein the robot arm includes:
   a first link member which is connected at its one end with the base, configured to be angularly displaced about the pivot axis, and at which a first joint axis is set in parallel to the pivot axis;
   a second link member which is connected at its one end with an other end of the first link member, configured to be angularly displaced about the first joint axis, and at which a second pivot axis is set in parallel to the pivot axis; and
   a third link member which is connected at its one end with an other end of the second link member, configured to be angularly displaced about the second joint axis, and includes the robot hand at an other end of the third link member for holding the wafer,
   wherein a first link distance L1 defined as a distance from the pivot axis to an end of the first link member, which is farthest in a radial direction toward the first joint axis relative to the pivot axis, is set to exceed ½ of the allowable length (B−L0−E) and to be equal to or less than the allowable length (B−L0−E) (i.e., ((B−L0−E)/2<L1≦B−L0−E).

3. The wafer transfer apparatus according to claim 2, wherein a first axis-to-axis distance L11 from the pivot axis to the first joint axis and a second axis-to-axis distance L12 from the first joint axis to the second joint axis are set to be equal to each other, and wherein a second link distance L2 defined as a distance from the second joint axis to an end of the second link member, which is farthest in a direction toward the first joint axis relative to the second joint axis, is set to exceed ½ of the allowable length (B−L0−E) and to be equal to or less than the allowable length (B−L0−E).

4. The wafer transfer apparatus according to claim 3, wherein a third link distance L3 defined as a distance from the second joint axis to an end of the third link member or a portion of the wafer, which is farthest in a radial direction relative to the second joint axis, is set to exceed ½ of the allowable length (B−L0−E) and to be equal to or less than the allowable length (B−L0−E).

5. The wafer transfer apparatus according to claim 4, wherein the first link distance L1, the second link distance L2 and the third link distance L3 are respectively set to be equal to the allowable length (B−L0−E).

6. The wafer transfer apparatus according to claim 1, wherein the front opening includes four openings which are formed in the interface space forming portion, the four openings being arranged in left and right directions orthogonal to both the forward and backward directions and a direction of the pivot axis, and wherein the FOUP opener includes four openers which are provided in order to open and close the four openings, respectively.

7. A substrate transfer apparatus for transferring a substrate, relative to a substrate processing apparatus for processing the substrate, comprising:

an interface space forming portion defining an interface space, the interface space forming portion having a front wall and a rear wall which are arranged in predetermined forward and backward directions at an interval, the front wall having a first transfer port formed therein, and the rear wall having a second transfer port formed therein;

an opening and closing unit configured to open and close the first transfer port of the interface space forming portion; and a substrate carrying robot located in the interface space and configured to carry the substrate between the first transfer port and the second transfer port, wherein the substrate carrying robot includes:
a base which is fixed to the interface space forming portion and at which a predetermined pivot axis is set;
a first link member which is connected at its one end with the base, configured to be angularly displaced about the pivot axis, and at which a first joint axis is set in parallel to the pivot axis;
a second link member which is connected at its one end with an other end of the first link member, configured to be angularly displaced about the first joint axis, and at which a second pivot axis is set in parallel to the pivot axis;
a third link member which is connected at its one end with an other end of the second link member, configured to be angularly displaced about the second joint axis, and includes a robot hand at an other end thereof for holding the substrate; and
a drive unit configured to drive each of the link members so that the link members are angularly displaced, individually, about each corresponding axis, wherein the pivot axis is located nearer to the rear wall than to the front wall or nearer to the front wall than to the rear wall in the forward and backward directions, and wherein a first link distance L1 defined as a distance from the pivot axis to an end of the first link member, which is farthest in a radial direction toward the first joint axis relative to the pivot axis, is set to exceed ½ of a length B in the forward and backward directions of the interface space, the length B corresponding to a length between the front wall and the rear wall of the interface space forming portion, and is further set to be equal to or less than a subtracted value (B−L0) to be obtained by subtracting a distance L0 in the forward and backward directions from the rear wall of the interface space forming portion to the pivot axis, from the length B in the forward and backward directions of the interface space (i.e., B/2<L1≦B−L0), and the first link distance L1 is set to be equal to or less than an allowable length (B−L0−E) to be obtained by subtracting the distance L0 in the forward and backward directions from the rear wall of the interface space forming portion to the pivot axis and a length E of a robot invasion restricted region, which is set for the FOUP opener and is measured from the front wall in the forward and backward directions toward the rear wall, from the length B in the forward and backward directions of the interface space (i.e., L1≦B−L0−E).

8. A wafer transfer apparatus for transferring a wafer, comprising:

an interface space forming portion defining an interface space, the interface space forming portion having a front wall and a rear wall which are arranged at a predetermined interval in forward and backward directions, the front wall having a front opening formed therein, and the rear wall having a rear opening formed therein;

a FOUP opener configured to open and close the substrate container located adjacent to the interface space and the front opening of the interface space forming portion; and a wafer carrying robot located in the interface space and configured to carry the wafer between the front opening and the rear opening, wherein the wafer carrying robot includes:
a base which is fixed to the interface space forming portion and at which a predetermined pivot axis is set;
a robot arm having a proximal end and a distal end, the robot arm including a plurality of link members connected with one another in succession in a direction from the proximal end to the distal end, the proximal end being connected with the base, the distal end being provided with a robot hand for holding the wafer, the robot arm being configured to be angularly displaced about the pivot axis; and
a drive unit configured to drive each of the link members of the robot arm so that the link members are angularly displaced, individually, about each corresponding axis, wherein, in a minimum transformed state where the robot arm is transformed such that a distance defined from the pivot axis to an arm portion which is farthest in a radial direction relative to the pivot axis is minimum, a minimum rotation radius R, as the distance defined from the pivot axis to the arm portion which is the farthest in the radial direction relative to the pivot axis, is set to exceed ½ of a length B in the forward and backward directions of the interface space, the length B corresponding to a length between the front wall and the rear wall of the interface space forming portion, and is further set to be equal to or less than a subtracted value (B−L0) to be obtained by subtracting a distance L0 set to be greater by a predetermined gap length Q than a radius T2 of an outer circumference of the first link member about the pivot axis (L0=T2+Q), from the length B in the forward and backward directions of the interface space (i.e., B/2<R≦B−L0), and the minimum rotation radius R is set to be equal to or less than an allowable length (B−L0−E) to be obtained by subtracting the distance L0 set to be greater by the predetermined gap length Q than the radius T2 of an outer circumference of the first link member about the pivot axis and a length E of a robot invasion restricted region, which is set for the FOUP opener and is measured from the front wall in the forward and backward directions toward the rear wall, from the length B in the forward and backward directions of the interface space (i.e., R<B−L0−E).

9. The wafer transfer apparatus according to claim 8, wherein the robot arm includes:

a first link member which is connected at its one end with the base, configured to be angularly displaced about the pivot axis, and at which a first joint axis is set in parallel to the pivot axis;

a second link member which is connected at its one end with an other end of the first link member, configured to be angularly displaced about the first joint axis, and at which a second pivot axis is set in parallel to the pivot axis; and a third link member which is connected at its one end with an other end of the second link member, configured to be angularly displaced about the second joint axis, and includes the robot hand at an other end of the third link member for holding the wafer, wherein a first link distance L1 defined as a distance from the pivot axis to an end of the first link member, which is farthest in a radial direction toward the first joint axis relative to the pivot axis, is set to exceed ½ of the allowable length (B−L0−E) and to be equal to or less than the allowable length (B−L0−E) (i.e., ((B−L0−E)/2<L1≦B−L0−E).

10. The wafer transfer apparatus according to claim 9, wherein a first axis-to-axis distance L11 from the pivot axis to the first joint axis and a second axis-to-axis distance L12 from the first joint axis to the second joint axis are set to be equal to each other, and wherein a second link distance L2 defined as a distance from the second joint axis to an end of the second link member, which is farthest in a direction toward the first joint axis relative to the second joint axis, is set to exceed ½ of the allowable length (B−L0−E) and to be equal to or less than the allowable length (B−L0−E).

11. The wafer transfer apparatus according to claim 10, wherein a third link distance L3 defined as a distance from the second joint axis to an end of the third link member or a portion of the wafer, which is farthest in a radial direction relative to the second joint axis, is set to exceed ½ of the allowable length (B−L0−E) and to be equal to or less than the allowable length (B−L0−E).

12. The wafer transfer apparatus according to claim 11, wherein the first link distance L1, the second link distance L2 and the third link distance L3 are respectively set to be equal to the allowable length (B−L0−E).

13. The wafer transfer apparatus according to claim 8, wherein the front opening includes four openings which are formed in the interface space forming portion, the four openings being arranged in left and right directions orthogonal to both the forward and backward directions and a direction of the pivot axis, and wherein the FOUP opener includes four openers which are provided in order to open and close the four openings, respectively.

14. A substrate transfer apparatus for transferring a substrate, relative to a substrate processing apparatus for processing the substrate, comprising:

an interface space forming portion defining an interface space, the interface space forming portion having a front wall and a rear wall which are arranged in predetermined forward and backward directions at an interval, the front wall having a first transfer port formed therein, and the rear wall having a second transfer port formed therein;

an opening and closing unit configured to open and close the first transfer port of the interface space forming portion; and a substrate carrying robot located in the interface space and configured to carry the substrate between the first transfer port and the second transfer port, wherein the substrate carrying robot includes:

a base which is fixed to the interface space forming portion and at which a predetermined pivot axis is set;

a first link member which is connected at its one end with the base, configured to be angularly displaced about the pivot axis, and at which a first joint axis is set in parallel to the pivot axis;

a second link member which is connected at its one end with an other end of the first link member, configured to be angularly displaced about the first joint axis, and at which a second pivot axis is set in parallel to the pivot axis;

a third link member which is connected at its one end with an other end of the second link member, configured to be angularly displaced about the second joint axis, and includes a robot hand at an other end thereof for holding the substrate; and a drive unit configured to drive each of the link members so that the link members are angularly displaced, individually, about each corresponding axis, wherein the pivot axis is located nearer to the rear wall than to the front wall or nearer to the front wall than to the rear wall in the forward and backward directions, and wherein a first link distance L1 defined as a distance from the pivot axis to an end of the first link member, which is farthest in a radial direction toward the first joint axis relative to the pivot axis, is set to exceed ½ of a length B in the forward and backward directions of the interface space, the length B corresponding to a length between the front wall and the rear wall of the interface space forming portion, and is further set to be equal to or less than a subtracted value (B−L0) to be obtained by subtracting a distance L0 set to be greater by a predetermined gap length Q than a radius T2 of an outer circumference of the first link member about the pivot axis (L0=T2+Q), from the length B in the forward and backward directions of the interface space (i.e., B/2<L1≦B−L0), and the first link distance L1 is set to be equal to or less than an allowable length (B−L0−E) to be obtained by subtracting the distance L0 set to be greater by the predetermined gap length Q than the radius T2 of an outer circumference of the first link member about the pivot axis and a length E of a robot invasion restricted region, which is set for the FOUP opener and is measured from the front wall in the forward and backward directions toward the rear wall, from the length B in the forward and backward directions of the interface space (i.e., L1≦B−L0−E).

* * * * *